(12) United States Patent
Kim et al.

(10) Patent No.: US 10,411,033 B2
(45) Date of Patent: Sep. 10, 2019

(54) SEMICONDUCTOR DEVICE INCLUDING VERTICAL CHANNEL LAYER

(71) Applicant: SAMSUNG ELECTRONICS CO., LTD., Suwon-si, Gyeonggi-do (KR)

(72) Inventors: Kwang-soo Kim, Hwaseong-si (KR); Yong-seok Kim, Suwon-si (KR); Tae-hun Kim, Gwacheon-si (KR); Min-kyung Bae, Hwaseong-si (KR); Jae-hoon Jang, Seongnam-si (KR); Kohji Kanamori, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/993,756

(22) Filed: May 31, 2018

(65) Prior Publication Data

US 2018/0374869 A1    Dec. 27, 2018

(30) Foreign Application Priority Data

Jun. 21, 2017  (KR) .......................... 10-2017-0078589

(51) Int. Cl.
*H01L 27/11582*  (2017.01)
*H01L 29/08*  (2006.01)
*H01L 29/78*  (2006.01)

(52) U.S. Cl.
CPC .... *H01L 27/11582* (2013.01); *H01L 29/0847* (2013.01); *H01L 29/7827* (2013.01)

(58) Field of Classification Search
None
See application file for complete search history.

(56) References Cited

U.S. PATENT DOCUMENTS

| | | | |
|---|---|---|---|
| 9,099,527 B2 | 8/2015 | Yoo | |
| 9,209,031 B2 | 12/2015 | Baenninger et al. | |
| 9,245,962 B1 | 1/2016 | Yang et al. | |
| 9,455,263 B2 | 9/2016 | Zhang et al. | |
| 2012/0199897 A1 | 8/2012 | Chang et al. | |
| 2013/0161731 A1* | 6/2013 | Bin | H01L 29/78 257/329 |
| 2014/0131783 A1 | 5/2014 | Lee et al. | |

(Continued)

OTHER PUBLICATIONS

Singapore Search Report and Written Opinion dated Dec. 5, 2018 for the corresponding application 10201805060X.

*Primary Examiner* — Dung A. Le
(74) *Attorney, Agent, or Firm* — Lee & Morse, P.C.

(57) ABSTRACT

A semiconductor device includes a plurality of channel structures on a substrate, each channel structure extending in a first direction perpendicular to the substrate, and having a gate insulating layer and a channel layer, a common source extension region including a first semiconductor layer having an n-type conductivity between the substrate and the channel structures, a plurality of gate electrodes on the common source extension region and spaced apart from each other on a sidewall of each of the channel structures in the first direction, and a common source region on the substrate in contact with the common source extension region and including a second semiconductor layer having an n-type conductivity, wherein the gate insulating layer of each of the channel structures extends to cover an upper surface and at least a portion of a bottom surface of the common source extension region.

16 Claims, 19 Drawing Sheets

(56) References Cited

U.S. PATENT DOCUMENTS

| | | |
|---|---|---|
| 2015/0221667 A1 | 8/2015 | Fukuzumi et al. |
| 2016/0064406 A1 | 3/2016 | Natori et al. |
| 2016/0071868 A1 | 3/2016 | Arai |
| 2016/0079265 A1 | 3/2016 | Akutsu et al. |
| 2016/0181264 A1 | 6/2016 | Miyamoto et al. |
| 2016/0343730 A1 | 11/2016 | Son et al. |
| 2017/0051409 A1* | 2/2017 | Noh ............... C23C 16/045 |
| 2017/0084624 A1 | 3/2017 | Lee et al. |
| 2017/0133389 A1 | 5/2017 | Yun et al. |
| 2017/0162594 A1 | 6/2017 | Ahn |
| 2018/0122959 A1* | 5/2018 | Calka ............... C23C 16/34 |

\* cited by examiner

SEMICONDUCTOR DEVICE INCLUDING VERTICAL CHANNEL LAYER

CROSS-REFERENCE TO RELATED APPLICATION

Korean Patent Application No. 10-2017-0078589, filed on Jun. 21, 2017, in the Korean Intellectual Property Office, and entitled: "Semiconductor Device and Method of Manufacturing the Same," is incorporated by reference herein in its entirety.

BACKGROUND

1. Field

Embodiments relate to a semiconductor device and a method of manufacturing the semiconductor device, and more particularly, to a semiconductor device including a vertical channel layer and a method of manufacturing the semiconductor device.

2. Description of the Related Art

As the integration degree of memory devices has increased, a memory device having a vertical transistor structure has been suggested instead of those having a planar transistor structure. A memory device having the vertical transistor structure includes a vertical channel layer extending on a substrate in a vertical direction.

SUMMARY

According to an aspect of embodiments, there is provided a semiconductor device including a plurality of channel structures on a substrate, each of the plurality of channel structures having a gate insulating layer and a channel layer and extending in a first direction perpendicular to an upper surface of the substrate, a common source extension region disposed between the substrate and the plurality of channel structures and including a first semiconductor layer having an n-type conductivity, a plurality of gate electrodes disposed on the common source extension region and spaced apart from each other on a sidewall of each of the plurality of channel structures in the first direction, and a common source region disposed on the substrate, the common source region being in contact with the common source extension region and including a second semiconductor layer having an n-type conductivity, wherein the gate insulating layer of each of the plurality of channel structures extends to cover an upper surface and at least a portion of a bottom surface of the common source extension region.

According to another aspect of embodiments, there is provided a semiconductor device including: a base layer disposed on a substrate and having an n-type conductivity, a common source extension region disposed on the base layer and including a first semiconductor layer having an n-type conductivity, a plurality of channel structures disposed on the common source extension region and extending in a first direction perpendicular to an upper surface of the substrate, each of the plurality of channel structures having a gate insulating layer and a channel layer, a plurality of gate electrodes disposed on the common source extension region and spaced apart from each other on a sidewall of each of the plurality of channel structures in the first direction, and a common source region disposed on the substrate, the common source region being in contact with a portion of a bottom surface of the common source extension region and including a second semiconductor layer having an n-type conductivity, wherein a portion of the gate insulating layer of each of the plurality of channel structures extends to cover an upper surface and at least a portion of the bottom surface of the common source extension region.

According to yet another aspect of embodiments, there is provided a method of manufacturing a semiconductor device, the method including: forming a sacrificial layer on a substrate, forming a gate mold structure on the sacrificial layer, the gate mold structure including a plurality of first material layers and a plurality of second material layers that are alternately arranged, forming a plurality of channel holes passing through the gate mold structure to expose the sacrificial layer, forming a first recess by removing the sacrificial layer, forming a gate insulating layer on an inner wall of the first recess and an inner wall of the plurality of channel holes, forming a common source extension region filling the first recess, forming a common source opening portion passing through the gate mold structure, and forming a common source region filling a bottom portion of the common source opening portion.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, embodiments will be described more fully hereinafter with reference to the accompanying drawings.

Figure 1:
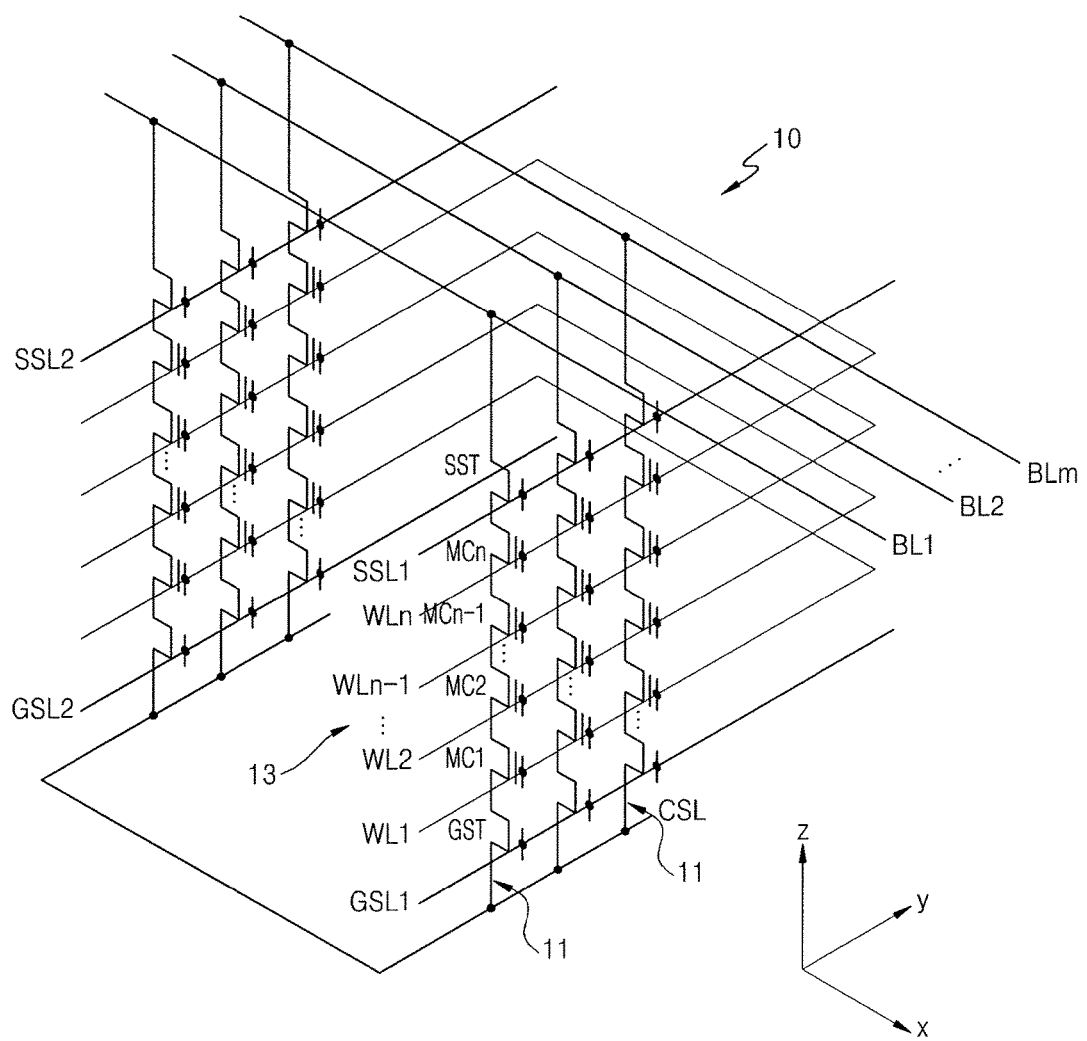
FIG. 1 illustrates an equivalent circuit diagram of a memory cell array of a semiconductor device according to example embodiments.

FIG. 1 is an equivalent circuit diagram of a memory cell array 10 of a semiconductor device according to example embodiments, e.g., an equivalent circuit diagram of a vertical NAND (VNAND) flash memory device having a vertical channel structure.

Referring to FIG. 1, the memory cell array 10 of the semiconductor device according to the example embodiments may include a plurality of memory cell strings 11. Each of the memory cell strings 11 may have a vertical structure extending in a direction perpendicular to a main surface of a substrate, e.g., along a direction normal to an upper surface of the substrate (i.e., along the z-direction). The plurality of memory cell strings 11 may constitute a memory cell block 13.

Each of the memory cell strings 11 may include a plurality of memory cells MC1 through MCn, a string selection transistor SST, and a ground selection transistor GST. In each of the memory cell strings 11, the ground selection transistor GST, the memory cells MC1 through MCn, and the string selection transistor SST may be vertically (i.e., in the z-direction) disposed in series. Here, the memory cells MC1 through MCn may be configured to store data. A plurality of word lines WL1 through WLn may be respectively included in and be configured to control the memory cells MC1 through MCn. The number of the plurality of memory cells MC1 through MCn may be appropriately selected according to a capacity of the semiconductor device.

A plurality of bit lines BL1 through BLm (extending in an x-direction) may be respectively connected to ends of the memory cell strings 11, which are arranged in first through mth columns of the memory cell block 13, e.g., to drains of the string selection transistors SST, in a second direction (y-direction). A common source line CSL may be connected to other ends of the memory cell strings 11, e.g., to sources of the ground selection transistors GST.

A word line (for example, word line WL1) (extending in the y-direction) may be commonly connected to gate electrodes of memory cells arranged on the same layer of the plurality of memory cell strings 11 in the first direction (x direction). Data may be programmed in, read from, or erased from the memory cells MC1 through MCn according to driving states of the word lines WL1 through WLn.

The string selection transistors SST of the memory cell strings 11 may be arranged between a bit line (for example, bit line BL1) and an uppermost memory cell MCn. In the memory cell block 13, each of the string selection transistors SST may control data transmissions between the bit lines BL1 through BLm and the memory cells MC1 through MCn through string selection lines SSL1 and SSL2 connected to gate electrodes of the string selection transistors SST.

The ground selection transistors GST may be arranged between a lowermost memory cell MC1 and the common source line CSL. In the memory cell array 10, each of the ground selection transistors GST may control data transmissions between the plurality of memory cells MC1 through MCn and the common source line CSL through ground selection lines GSL1 and GSL2 connected to gate electrodes of the ground selection transistors GST.

According to example embodiments, a common source extension region 122 (see FIG. 2) having an n-type conductivity may be formed between the ground selection lines GSL1 and GSL2 and the common source line CSL, and accordingly, an erase operation of the memory cell array 10 may be performed using a gate induced drain leakage (GIDL) method. For example, when an erase voltage Ver is applied to the common source line CSL, and a reference voltage Vref is applied to the ground selection lines GSL1 and GSL2, due to a potential difference between the erase voltage Ver and the reference voltage Vref, a high electric field may be generated in the common source extension region 122, which is adjacent to the ground selection line GSL. Further, due to the high electric field, electrons and holes may be generated in the common source extension region 122. The holes generated in the common source extension region 122 may be injected into the memory cell strings 11 so as to perform an erase operation of the plurality of memory cells MC1 through MCn.

According to other example embodiments, unlike in FIG. 1, the ground selection lines GSL1 and GSL2 may have a double-layer structure including a first ground selection line and a second ground selection line, each arranged in the direction perpendicular to the main surface of the substrate (z-direction). In this case, one of the first and second ground selection lines may function as a gate electrode for generating holes for an erase operation, and the other may function as a gate electrode of the ground selection transistor GST.

According to a semiconductor device of a comparative example, an erase method using a substrate body may be used, and an erase operation of a plurality of memory cells may be performed by directly injecting holes from the substrate into a memory cell string that is electrically connected to the substrate. However, according to the comparative example, an additional bottom structure needs to be formed to provide an injection path for the holes from the substrate into the memory cell string, requiring a complicated process. In contrast, in the semiconductor device according to the example embodiments, an erase operation using a GIDL method may be performed using a simplified structure.

Figure 2:
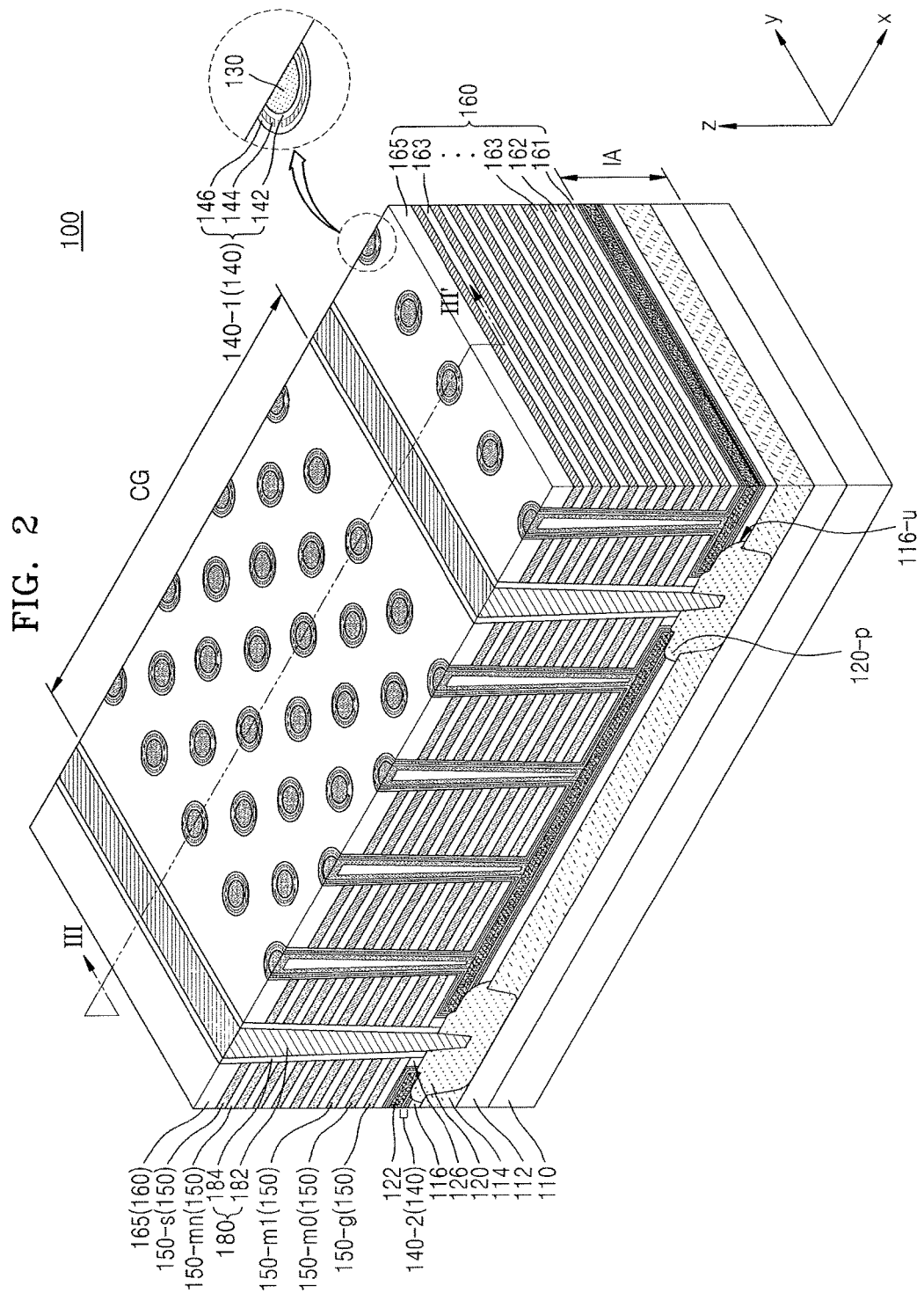
FIG. 2 illustrates a perspective view of a representative structure of a semiconductor device according to example embodiments.
Figure 3:
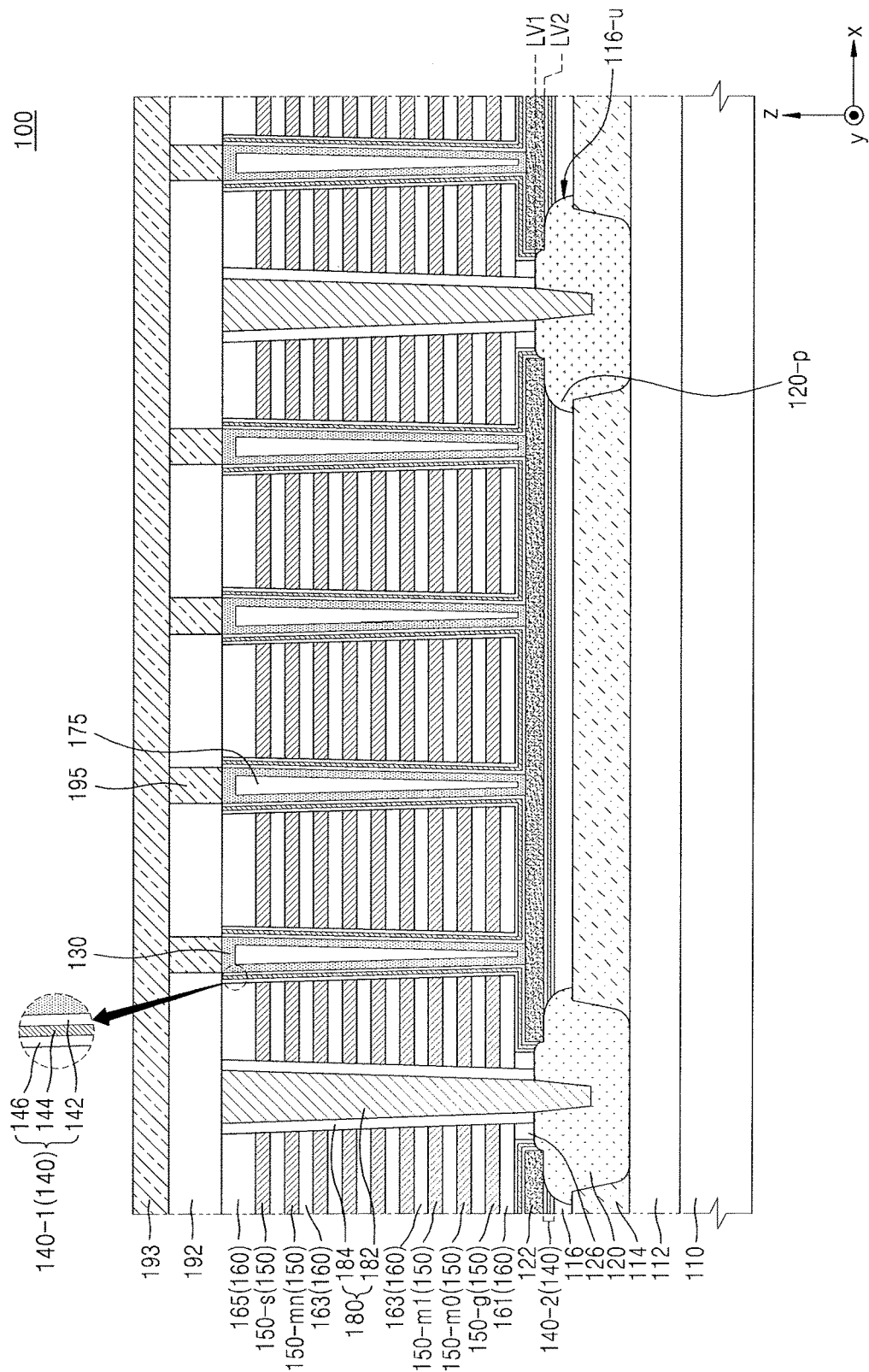
FIG. 3 illustrates a cross-sectional view taken along line of FIG. 2.

FIG. 2 is a perspective view of a representative structure of a semiconductor device 100 according to example embodiments, and FIG. 3 is a cross-sectional view of the semiconductor device 100 taken along line of FIG. 2. In FIG. 2, some elements such as bit lines, bit line contacts, word line contact plugs, and word line contact pads are omitted for convenience of illustration.

Referring to FIGS. 2 and 3, a substrate 110 may have a main surface extending in a first direction (x-direction) and a second direction (y-direction), e.g., the main surface of the substrate 110 is in the xy plane. The substrate 110 may include a semiconductor material, e.g., a Group IV semiconductor, a Group III-V compound semiconductor, or a Group II-VI compound semiconductor. For example, the Group IV semiconductor may include silicon (Si), germanium (Ge), or silicon-germanium. The substrate 110 may be a bulk wafer or an epitaxial layer. A cell region, i.e., a region in which a plurality of cell string array group regions CG are arranged, and a peripheral region, i.e., a region arranged outside the cell region, may be defined on the substrate 110.

A connection region IA may be disposed in the cell region of the substrate 110, and the cell string array group region CG may be disposed in the connection region IA. In example embodiments, the cell string array group regions CG may not be disposed in the peripheral region, and thus, no connection region IA may be disposed in the peripheral region.

The plurality of cell string array group regions CG may be disposed in the cell region of the substrate 110. The cell string array group regions CG may be disposed in the connection region IA, and may be separated from each other via an isolation region 180 in the first direction (x-direction). For example, FIG. 2 illustrates one cell string array group region CG between two isolation regions 180.

The plurality of memory cell strings 11 of FIG. 1 may be disposed in each of the cell string array group regions CG, e.g., each one of the memory cell strings 11 of FIG. 1 may correspond to a respective channel layer 130 in FIG. 2 (represented by the circles in the cell string array group region CG). For example, each of the memory cell strings 11 may include the ground selection transistor GST (FIG. 1), the plurality of memory cells MC1 through MCn (FIG. 1), and the string selection transistor SST (FIG. 1) along sidewalls of the respective channel layer 130. However, embodiments are not limited thereto, e.g., two ground selection transistors and two string selection transistors may be provided.

The channel layers 130 may have a structure extending in a third direction (z-direction) on the connection region IA. As illustrated in FIG. 2, the channel layers 130 may be spaced apart from each other in the first direction (x-direction) and the second direction (y-direction). In addition, a channel layer 130 in one line in one of the two directions, the first direction (x-direction) and the second direction (y-direction), may be arranged in a zigzag pattern with respect to a channel layer 130 disposed in another line adjacent to the line. That is, two adjacent lines of the channel layers 130 may be offset with respect to each other in the y-direction and/or the x-direction to define a zigzag pattern.

While the semiconductor device 100 illustrated in FIG. 2 includes four channel layers 130 in the first direction (x-direction), the arrangement of the channel layers 130 is not limited thereto. For example, three or less channel layers 130 or five or more channel layers 130 may be arranged in the first direction (x-direction). The channel layers 130 may have, for example, a cylindrical shape. In addition, the shape of the channel layers 130 is not limited to a cylindrical shape, but may also be a cylindrical pillar shape or a square pillar shape, or the channel layers 130 may be formed only on both lateral surfaces and a bottom surface of a square pillar.

The channel layers 130 may include a semiconductor material, e.g., polysilicon or single crystalline silicon. The semiconductor material may be doped with a p-type or n-type impurity ion. A buried insulating layer 175 may be formed inside the channel layers 130 (FIG. 3). In example embodiments, the buried insulating layer 175 may have a cylindrical pillar structure, or voids may be formed in the buried insulating layer 175. When the channel layers 130 have a pillar shape, the buried insulating layer 175 may be omitted.

A gate insulating layer 140 may include a first gate insulating layer 140-1 arranged along a side wall of the channel layers 130, and a second gate insulating layer 140-2 extending from a bottom portion of the channel layers 130 in a horizontal direction. The first gate insulating layer 140-1 and the second gate insulating layer 140-2 may each have a structure in which a tunneling insulating layer 142, a charge storage layer 144, and a blocking insulating layer 146 are sequentially stacked. The tunneling insulating layer 142 may tunnel charges from the channel layer 130 to the charge storage layer 144. For example, the tunneling insulating layer 142 may include silicon oxide. The charge storage layer 144 may include a charge trap layer. The charge storage layer 144 may include quantum dots or nanocrystals. Here, the quantum dots or the nanocrystals may be formed of fine particles of a conductor, e.g., fine particles of a metal or a semiconductor. The blocking insulating layer 146 may include a high-k dielectric material. The high-k dielectric material refers to a dielectric material having a higher dielectric constant than that of a silicon oxide layer.

A bit line 193 (the bit lines BL1 through BLm of FIG. 1) may be connected to a drain of the string selection transistors SST (FIG. 1). For example, the bit line 193 may extend in the first direction (x-direction) and may have line shapes separated from each other in the second direction (y-direction). The bit line 193 may be electrically connected to the string selection transistors SST (FIG. 1) via a contact plug 195 formed on the channel layers 130, as illustrated in FIG. 3.

As illustrated in FIGS. 2-3, the isolation regions 180 may be formed between adjacent memory cell strings that use different gate electrodes 150 from each other. The isolation regions 180 may extend in the second direction (y-direction), be spaced apart from each other in the first direction (x-direction), and separate the gate electrodes 150 from each other in the first direction (x-direction). An impurity region may be disposed in the connection region IA under the isolation regions 180, and the ground selection transistors GST (FIG. 1) may be electrically connected to the impurity region adjacent to the ground selection transistors GST.

The isolation region 180 may include a metal layer 182 and an insulation spacer 184. The metal layer 182 of the isolation region 180 may be disposed on the impurity region. The metal layer 182 may correspond to a common source line. A metal silicide, e.g., a cobalt silicide ($CoSi_x$) or a tungsten silicide ($WSi_x$), may be formed at a lower end of the metal layer 182. The metal layer 182 may be formed of, e.g., W, Al or Cu. In example embodiments, the metal layer 182 may also have a structure in which a barrier metal layer, e.g., Ti/TiN, and a wiring metal layer, e.g., tungsten, are stacked.

In example embodiments, the metal layer 182 and the insulation spacer 184 may have a structure extending to a level higher than that of a top surface of a gate electrode 150-s of the string selection transistors SST (FIG. 1), e.g., relative to the substrate 110. However, the structure of the isolation region 180 is not limited thereto. For example, the isolation region 180 may have a structure in which the metal layer 182 has a small thickness and is formed adjacent to the impurity region so that the metal layer 182 is extended to a level lower than that of a top surface of a lowermost interlayer insulating layer 161, and a buried insulating layer is disposed on the metal layer 182. In the above-described structure, an insulation spacer may be omitted. In another example, the isolation region 180 may also be formed such that the insulation spacer 184 is formed only up to a side wall of a gate electrode 150-g of the ground selection transistor GST (FIG. 1) so that the metal layer 182 is formed at a predetermined height between the insulation spacers 184, and a buried insulating layer is disposed on the metal layer 182.

The gate electrodes 150 may be disposed in a structure in which the gate electrodes 150 and interlayer insulating layers 160 are alternately stacked in the third direction (z-direction) along the sidewall of the channel layer 130 from the connection region IA. The gate electrodes 150 may include the gate electrode 150-g of the ground selection transistor GST (FIG. 1), gate electrodes 150-m1 through 150-mn of a plurality of memory cells MC1 through MCn (FIG. 1), the gate electrode 150-s of the string selection transistor SST (FIG. 1), and a dummy gate electrode 150-m0.

The gate electrodes 150 may be commonly connected to the memory cell strings. The gate electrode 150-s of the string selection transistor SST (FIG. 1) may be connected to the string selection line SSL (FIG. 1). The gate electrodes 150-m1 through 150-mn of the memory cells MC1 through MCn (FIG. 1) may be connected to the word lines WL1, WL2, WLn−1, and WLn (FIG. 1). The gate electrode 150-g of the ground selection transistor GST (FIG. 1) may be connected to the ground selection line GSL (FIG. 1). The gate electrodes 150 may be formed of a metal, e.g., tungsten (W). In addition, although not illustrated, the gate electrodes 150 may further include a diffusion barrier, which may include, e.g., one of a tungsten nitride (WN), a tantalum nitride (TaN), and a titanium nitride (TiN).

The interlayer insulating layers 160 may be disposed between the gate electrodes 150. Like the gate electrodes 150, the interlayer insulating layers 160 may be spaced apart from each other in the third direction (z-direction) and extend in the second direction (y-direction). For example, the interlayer insulating layers 160 may be formed of silicon oxide or silicon nitride. The lowermost interlayer insulating layer 161, an interlayer insulating layer 162 between the lowermost gate electrode 150-g and the dummy gate electrode 150-m0, an interlayer insulating layer 163 between the gate electrodes 150-m1 through 150-mn of the memory cells, and an uppermost interlayer insulating layer 165 may be collectively referred to as the interlayer insulating layers 160.

In example embodiments, the dummy gate electrode 150-m0 above the gate electrode 150-g of the ground selection transistor GST (FIG. 1) is a dummy gate electrode and may not constitute a memory cell. In a VNAND structure according to the related art, an interlayer insulating layer between the lowermost gate electrode 150-g and the dummy gate electrode 150-m0 may be thicker than an interlayer insulating layer between the gate electrodes 150-m1 through 150-mn of the memory cells. In contrast, in example embodiments, the interlayer insulating layer 162 between the lowermost gate electrode 150-g and the dummy gate electrode 150-m0 may have a substantially same thickness as the interlayer insulating layer 163 in portions of the memory cells.

The connection region IA may be disposed between the substrate 110 and the cell string array group regions CG. The connection region IA may include an isolation insulating layer 112, a base layer 114, a first lower insulating layer 116, a common source region 120, and a common source extension region 122.

The isolation insulating layer 112 may be disposed on the substrate 110. The isolation insulating layer 112 may electrically insulate the substrate 110 from the plurality of cell string array group regions CG. For example, as illustrated in FIG. 2, the isolation insulating layer 112 may be immediately disposed on the substrate 110, e.g., the isolation insulating layer 112 may be directly on the substrate 110. In another example, as referred to as a cell over periphery (COP) structure, a driving transistor region for driving the cell string array group regions CG may be further formed between the substrate 110 and the isolation insulating layer 112. In this case, the isolation insulating layer 112 may have a relatively large thickness so as to cover the driving transistor region.

The base layer 114 including a semiconductor layer having an n-type conductivity may be formed on the isolation insulating layer 112. For example, the base layer 114 may include a polysilicon layer doped with n-type conductivity impurities. The base layer 114 may be disposed substantially on the entire region of the substrate 110 overlapping the cell string array group regions CG.

The common source region 120 may be disposed on the isolation insulating layer 112, under the isolation region 180. Sidewalls of the common source region 120 contact the base layer 114, and may extend in the second direction (y-direction) on the isolation insulating layer 112. In FIGS. 2 and 3, the common source region 120 is illustrated as having a bottom surface at an identical level as a bottom surface of the base layer 114. However, embodiments are not limited thereto, and a portion of the base layer 114 may be disposed between the common source region 120 and the isolation insulating layer 112 so that the common source region 120 does not directly contact the isolation insulating layer 112, and a bottom surface of the common source region 120 may be surrounded by the base layer 114.

The metal layer 182 of the isolation region 180 may be disposed on the common source region 120, and a metal silicide layer may be further formed between the common source region 120 and the metal layer 182. The common source region 120 may include a semiconductor layer having an n-type conductivity. For example, the common source region 120 may include a polysilicon layer doped with n-type conductivity impurities. The common source region 120 may be a high-concentration impurity region for ohmic contact with the metal layer 182.

As illustrated in FIG. 2, the common source region 120 may be disposed under the isolation region 180 that isolates the gate electrodes 150 from each other. The isolation region 180 may be formed in a portion of a word line cut. The word line cut may refer to an isolation trench or a common source opening portion Tw1 (see FIG. 12) that is formed to extend in the second direction (y-direction) to isolate the gate electrodes 150.

The common source extension region 122 may be disposed between the base layer 114 and the cell string array group regions CG. A portion of a bottom surface of the common source extension region 122 (for example, a bottom surface of both end portions of the common source extension region 122 adjacent to the isolation region 180) may contact the common source region 120. The common source extension region 122 may include a semiconductor layer having an n-type conductivity. For example, the common source extension region 122 may include a polysilicon layer doped with n-type conductivity impurities.

As illustrated in FIGS. 2 and 3, an upper surface, a sidewall, and a portion of the bottom surface of the common source extension region 122 may be surrounded by the second gate insulating layer 140-2. As described above, the gate insulating layer 140 may include the first gate insulating layer 140-1 and the second gate insulating layer 140-2, and the first gate insulating layer 140-1 may extend along the sidewall of the channel layer 130 in the third direction (z-direction). The second gate insulating layer 140-2 may extend form a bottom portion of the channel layer 130 in a horizontal direction so as to conformally cover the upper surface, the sidewall, and the bottom surface of the common source extension region 122. A portion of the bottom surface of the common source extension region 122 that is not covered by the second gate insulating layer 140-2 may contact the common source region 120. The second gate insulating layer 140-2 may extend to a point of contact between the common source extension region 122 and the common source region 120 and contact the common source region 120.

The second gate insulating layer 140-2 may have a substantially identical layer structure or a substantially identical material composition (for example, a structure in which the tunneling insulating layer 142, the charge storage layer 144, and the blocking insulating layer 146 are sequentially formed) to the first gate insulating layer 140-1. For example, the second gate insulating layer 140-2 may be formed during the same process as the first gate insulating layer 140-1. Here, the second gate insulating layer 140-2 has a substantially identical layer structure as the first gate insulating layer 140-1, and does not function as a gate insulating layer.

The first lower insulating layer 116 may be formed between the base layer 114 and the common source extension region 122 and may contact the sidewalls of the common source region 120. A second lower insulating layer 126 may cover an upper surface of the common source region 120 between the isolation region 180 and the common source extension region 122. Unlike FIGS. 2 and 3, the first and second lower insulating layers 116 and 126 may also be formed as a single lower insulating layer so as to cover the sidewall and the bottom surface of the common source extension region 122 and also the upper surface of the common source region 120.

As illustrated in FIG. 3, an undercut region 116-*u* may be formed in a portion of the first lower insulating layer 116 between the common source extension region 122 and the base layer 114, and the common source region 120 may include a protrusion 120-*p* filling the undercut region 116-*u*. For example, a common source opening portion Tw1 (see FIG. 12) for forming the isolation region 180 may be formed, and the undercut region 116-*u* may be formed by using a selective etching process of expanding a bottom portion of the common source opening portion Tw1. In addition, through a process of forming the common source region 120 to fill the common source opening portion Tw1 that is expanded, the protrusion 120-*p* having a shape protruding outwardly along a profile of the undercut region 116-*u* may be formed.

As illustrated in FIG. 3, the upper surface of the common source region 120 may be at a first level LV1, and the bottom surface of the common source extension region 122 may be at a second level LV2 that is lower than the first level LV1. For example, through a selective etching process of expanding a bottom portion of the common source opening portion Tw1, a portion of the second lower insulating layer 126 may also be removed, and accordingly, the upper surface of the common source region 120 may be at a higher level than the bottom surface of the common source extension region 122.

The common source extension region 122 may function as a hole generating region for an erase operation performed using a GIDL method of the cell string array group regions CG. In detail, due to a potential difference between a reference voltage Vref applied to the gate electrode 150-*g* for the ground selection transistor GST and an erase voltage Ver applied to the common source line CSL, a high electric field may be applied to the common source extension region 122, and accordingly, electrons and holes may be generated in the common source extension region 122. The holes generated in the common source extension region 122 may be injected into the memory cell strings 11 (FIG. 1) so that the memory cells MC1 through MCn (FIG. 1) are erased. That is, as described with reference to FIG. 1, an erase operation using a GIDL method may be performed.

Semiconductor devices according to comparative example may be driven using an erase method in which a substrate body is used. In such semiconductor devices, holes may be injected from the substrate into memory cell strings that are electrically connected to the substrate. However, a bottom structure has to be formed using a complicated process in order to provide an injection path of holes from the substrate to the memory cell strings. For example, a semiconductor layer may be formed at a predetermined height from a bottom portion of a channel hole of the memory cell strings by using a selective epitaxial growth (SEG) process, and then a gate insulating layer may be formed on an inner wall of the channel hole, and an anisotropic etching process of removing a portion of the gate insulating layer on the bottom portion of the channel hole needs to be performed so as to expose an upper surface of the semiconductor layer. This process is complicated, and also may make scaling down of the channel hole difficult. In addition, reliability of the semiconductor devices may be degraded due to the complicated manufacturing process.

However, according to the semiconductor device of the example embodiments, an erase operation using a GIDL method may be performed using the common source extension region 122 having an n-type conductivity and the channel layer 130 disposed on the common source extension region 122. Accordingly, a bottom structure does not have to be formed using a complicated manufacturing method, and thus, the semiconductor device 100 having reliability may be obtained using a simplified manufacturing method.

Figure 4:
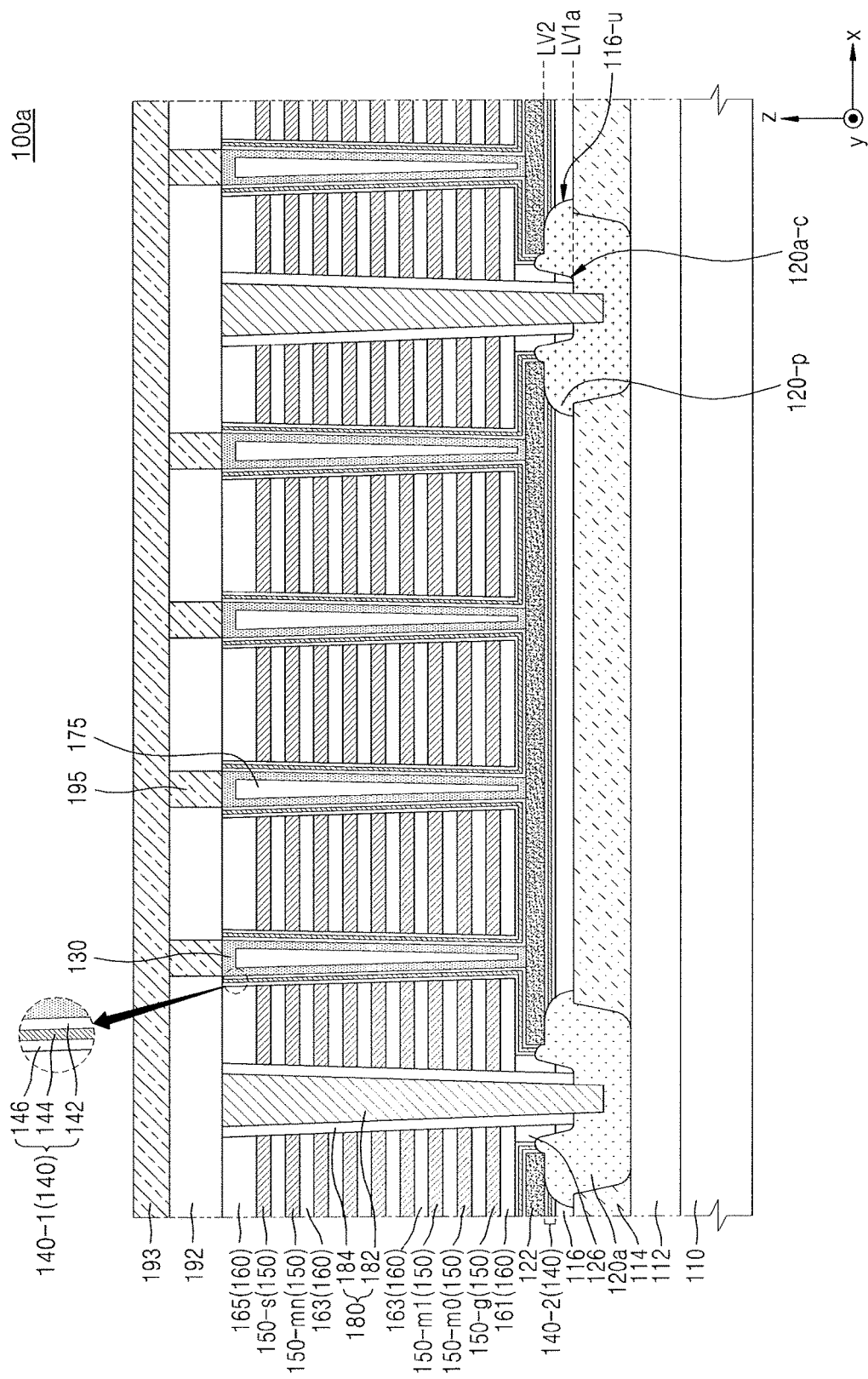
FIG. 4 illustrates a cross-sectional view of a semiconductor device according to example embodiments.

FIG. 4 is a cross-sectional view of a semiconductor device 100*a* according to example embodiments. In FIG. 4, like reference numerals as those in FIGS. 1 through 3 denote like elements. The semiconductor device 100*a* is similar to the semiconductor device 100 described with reference to FIGS. 2 and 3, except for a shape of a common source region 120*a*. Thus, description of FIG. 4 will focus on the shape of the common source region 120*a*.

Referring to FIG. 4, the common source region 120*a* may include a concave portion 120*a*-*c* in an upper portion thereof. Accordingly, an upper surface of the concave portion 120*a*-*c* may be at a first level LV1*a*, and a bottom surface of the common source extension region 122 may be at a second level LV2 higher than the first level LV1*a*. For example, when forming the common source opening portion Tw1 (see FIG. 12) for forming the isolation region 180, an upper portion of the base layer 114 may also be removed while forming the common source opening portion Tw1. If the upper portion of the base layer 114 is removed relatively deeply, due to the insulation spacer 184 formed on a sidewall of the common source opening portion Tw1, a height difference or a step portion may be generated on an upper surface of the common source opening portion Tw1 expanded during a selective etching process of expanding a bottom portion of the common source opening portion Tw1. Accordingly, the concave portion 120*a*-*c* may be formed on an upper surface of the common source region 120*a* that fills the bottom portion of the expanded common source opening portion Tw1 (or an expanded second recess R2-*e* (see FIG. 14)). The concave portion 120*a*-*c* may extend in the second direction (y-direction) (for example, in an extension direction of the isolation region 180).

Figure 5:
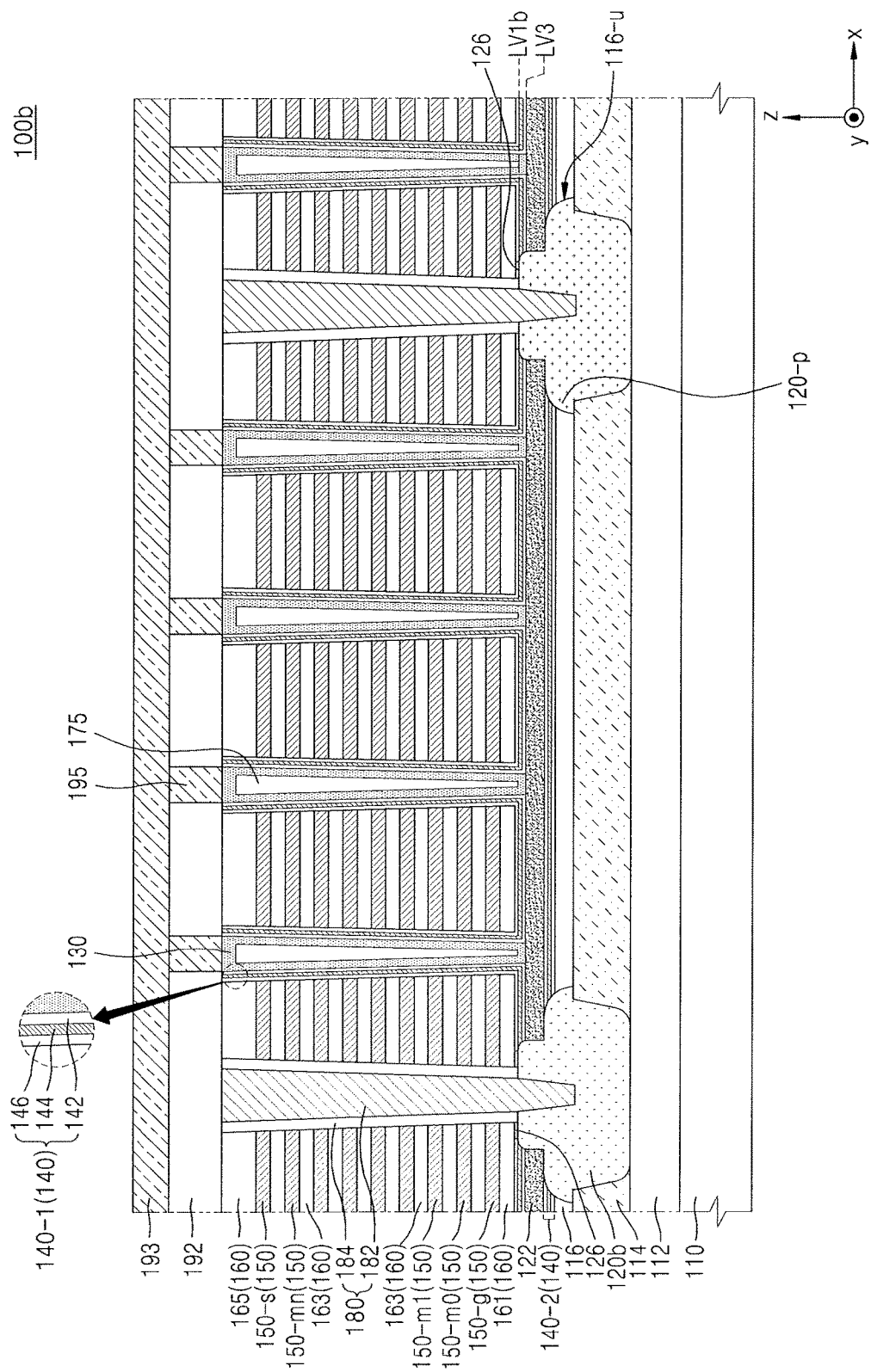
FIG. 5 illustrates a cross-sectional view of a semiconductor device according to example embodiments.

FIG. 5 is a cross-sectional view of a semiconductor device 100*b* according to example embodiments. In FIG. 5, like reference numerals as those in FIGS. 1 through 4 denote like elements. The semiconductor device 100*b* is similar to the semiconductor device 100 described with reference to FIGS. 2 and 3, except for a shape of a common source region 120*b*. Thus, description of FIG. 5 will focus on the shape of the common source region 120*b*.

Referring to FIG. 5, an upper surface of the common source region 120*b* may be at a first level LV1*b*, and an upper surface of the common source extension region 122 may be at a third level LV3 that is lower than or similar to the first level LV1*b*. A second gate insulating layer 140-2 may not be disposed on a sidewall of the common source extension region 122, and a substantially entire region of the sidewall of the common source extension region 122 (for example, a substantially entire region of the sidewall of the common source extension region 122 that overlaps the common source region 120*b*) may be surrounded by the common source region 120*b*. According to this structure, a contact area between the common source extension region 122 and the common source region 120*b* may be relatively large.

Figure 6:
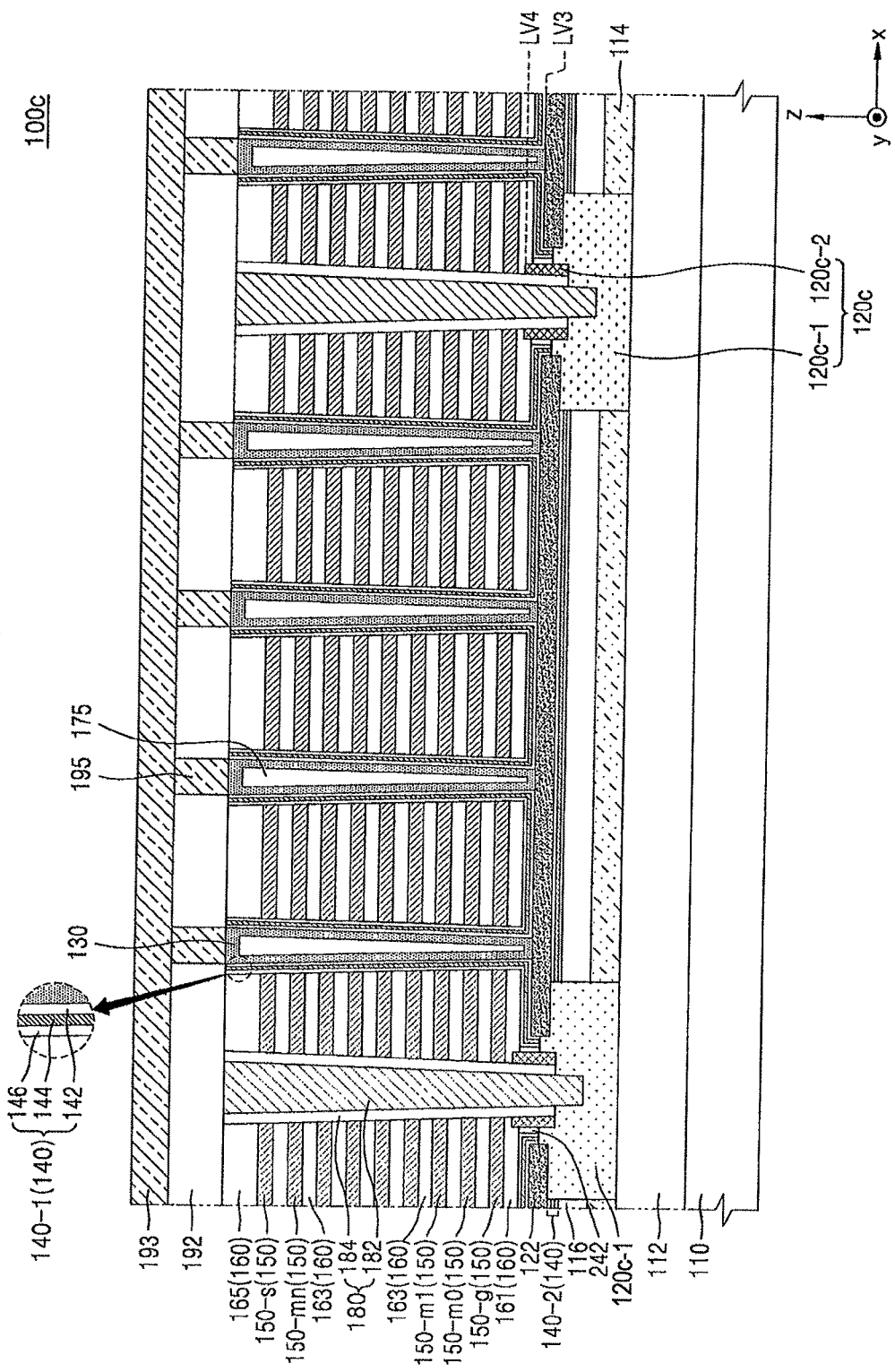
FIG. 6 illustrates a cross-sectional view of a semiconductor device according to example embodiments.

FIG. 6 is a cross-sectional view of a semiconductor device 100*c* according to example embodiments. In FIG. 6, like reference numerals as those in FIGS. 1 through 5 denote like elements. The semiconductor device 100*c* is similar to the semiconductor device 100 described with reference to FIGS.

2 and 3, except for a shape of a common source region 120c. Thus, description of FIG. 6 will focus on the shape of the common source region 120c.

Referring to FIG. 6, the common source region 120c may include a common source semiconductor layer 120c-1 and a support layer 120c-2.

The common source semiconductor layer 120c-1 may be disposed in a lateral direction with respect to the base layer 114 on the isolation insulating layer 112. The common source semiconductor layer 120c-1 may include a semiconductor layer having an n-type conductivity. For example, the common source semiconductor layer 120c-1 may be a polysilicon layer doped with n-type conductivity impurities.

The support layer 120c-2 may be disposed on the common source semiconductor layer 120c-1 to be spaced apart from the common source extension region 122. The support layer 120c-2 may include an n-type conductivity semiconductor layer or a metal layer. The support layer 120c-2 may be electrically connected to the common source extension region 122 via the common source semiconductor layer 120c-1. In example embodiments, the support layer 120c-2 may surround a lower sidewall of the isolation region 180 and extend in the second direction (y-direction).

An upper surface of the common source extension region 122 may be at a third level LV3, and an upper surface of the support layer 120c-2 may be at a fourth level LV4 higher than the third level LV3. For example, the support layer 120c-2 may be formed, after forming a plurality of first sacrificial layers 222S (see FIG. 7) for forming the common source extension region 122, by filling space between adjacent first sacrificial layers 222S with a conductive material. Here, an insulation liner 242 may be further formed between the support layer 120c-2 and the first sacrificial layers 222S so as to prevent direct contact between the support layer 120c-2 and the first sacrificial layers 222S. Next, when forming a common source opening portion Tw1-c (see FIG. 18) for forming the isolation region 180, the support layer 120c-2 may function as an etching stopper layer, and accordingly, an etching process for expanding the common source opening portion Tw1-c may be precisely adjusted. In addition, even if a distance between adjacent common source extension regions 122 is small, a relatively large contact area may be ensured between the metal layer 182 and the support layer 120c-2 and between the metal layer 182 and the common source semiconductor layer 120c-1. In addition, even if a distance between adjacent common source extension regions 122 is small, a common source region 120 having a relatively large volume may be formed, thus enabling stable driving of the semiconductor device 100c.

FIGS. 7 through 16 are cross-sectional views of stages in a method of manufacturing the semiconductor device 100 of the example embodiments, according to a process order. In FIGS. 7 through 16, like reference numerals as those in FIGS. 1 through 6 denote like elements.

Figure 7:
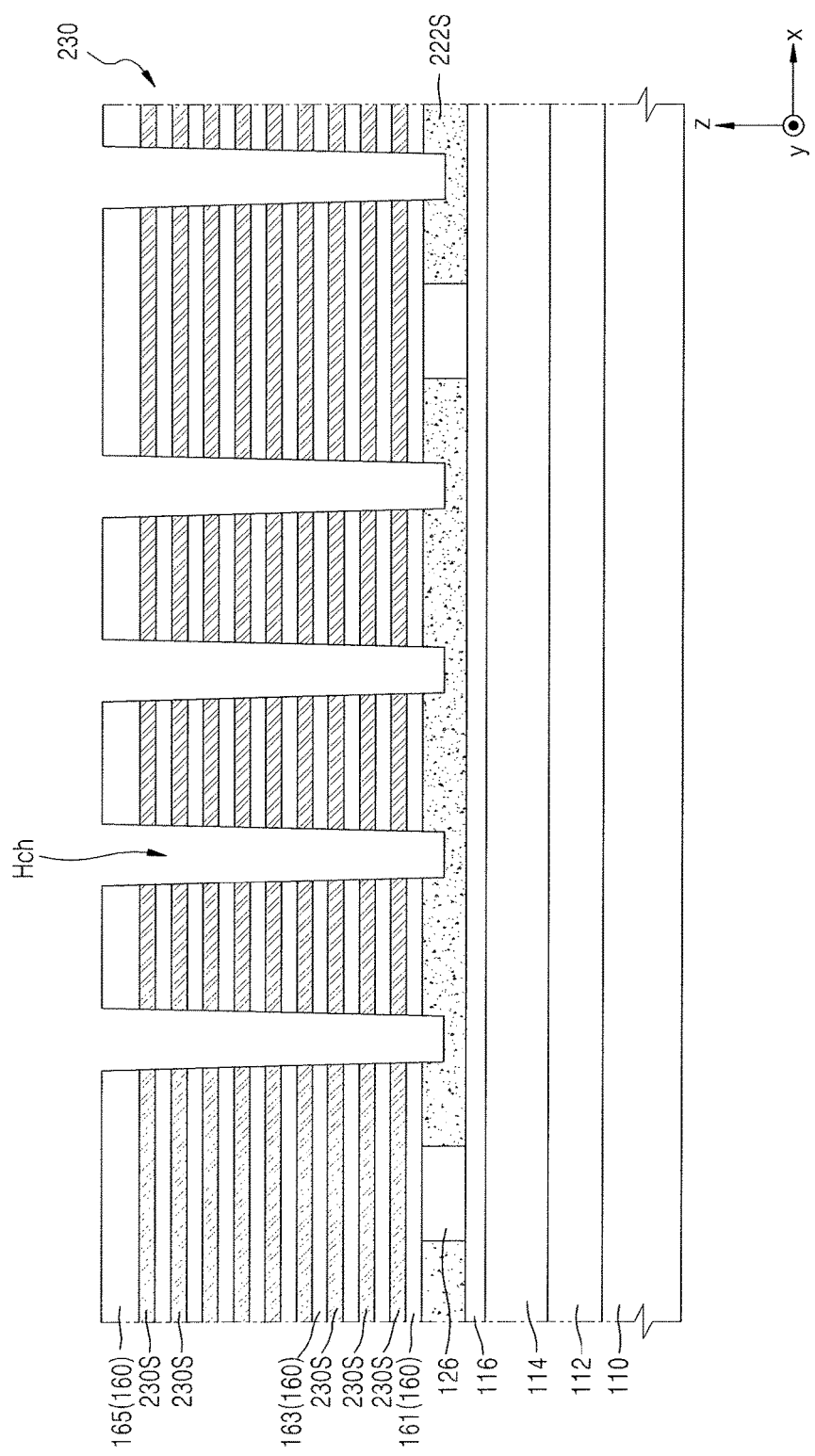
FIGS. 7 through 16 illustrate cross-sectional views of stages in a method of manufacturing a semiconductor device, according to example embodiments.

Referring to FIG. 7, the isolation insulating layer 112 may be formed on the substrate 110, and the base layer 114 may be formed on the isolation insulating layer 112. Next, the first lower insulating layer 116 may be formed on the base layer 114.

In example embodiments, the isolation insulating layer 112 and the first lower insulating layer 116 may be formed of an insulation material, e.g., silicon oxide, silicon nitride or silicon oxynitride. The base layer 114 may be formed of a semiconductor material, e.g., polysilicon, and by using a chemical vapor deposition (CVD) method or an atomic layer deposition (ALD) method. While forming the base layer 114, n-type conductivity impurities may be doped in situ.

Next, a conductive layer may be formed on the first lower insulating layer 116, and then a mask pattern may be formed on the conductive layer. The conductive layer may be patterned by using the mask pattern as an etching mask, thereby forming a plurality of first sacrificial layers 222S. For example, the plurality of first sacrificial layers 222S may be formed of polysilicon. However, a material for forming the plurality of first sacrificial layers 222S is not limited thereto. Any material having an etching selectivity with respect to the first lower insulating layer 116 disposed under the plurality of first sacrificial layers 222S and a second sacrificial layer 230S in a gate mold structure 230 to be formed in a subsequent process may be used to form the plurality of first sacrificial layers 222S.

An insulation material may be formed on the plurality of first sacrificial layers 222S and the first lower insulating layer 116 to fill spaces between the plurality of first sacrificial layers 222S. Then, an upper portion of the insulation material may be removed by performing a planarization process or the like until upper surfaces of the plurality of first sacrificial layers 222S are exposed so as to form the second lower insulating layer 126.

Next, the plurality of interlayer insulating layers 160 and the plurality of second sacrificial layers 230S may be alternately formed on the second lower insulating layer 126 to thereby form a gate mold structure 230 in which the plurality of interlayer insulating layers 160 and the plurality of second sacrificial layers 230S are alternately stacked. The number and thicknesses of each of the plurality of second sacrificial layers 230S and the plurality of interlayer insulating layers 160 may be varied according to a capacity and design of the semiconductor device 100. For example, a thickness of the lowermost interlayer insulating layer 161 from among the plurality of interlayer insulating layers 160 may be greater than or identical to a thickness of the other interlayer insulating layers 160. In addition, a thickness of the uppermost interlayer insulating layer 165 from among the plurality of interlayer insulating layers 160 may be greater than a thickness of the other interlayer insulating layers 160.

According to the semiconductor device of the comparative example, a lowermost interlayer insulating layer or a lowermost sacrificial layer may have a relatively large thickness for a SEG process. However, according to example embodiments, since the SEG process is not performed, the lowermost interlayer insulating layer 161 or the second sacrificial layer 230S in a lowermost portion may have substantially the same thickness as other interlayer insulating layers 160 or other second sacrificial layers 230S.

In example embodiments, the plurality of interlayer insulating layers 160 may be formed of an insulation material, e.g., silicon oxide, silicon nitride, or silicon oxynitride. In example embodiments, the plurality of second sacrificial layers 230S may be formed of an insulation material, e.g., silicon oxide, silicon nitride, or silicon oxynitride. The plurality of interlayer insulating layers 160 and the plurality of second sacrificial layers 230S may have an etching selectivity with respect to each other, and may be formed of a material having an etching selectivity with respect to the plurality of the first sacrificial layers 222S. For example, the plurality of first sacrificial layers 222S may include polysilicon, the plurality of interlayer insulating layers 160 may include silicon oxide, and the plurality of second sacrificial layers 230S may include silicon nitride.

Next, a channel hole Hch passing through the gate mold structure 230 may be formed to expose an upper surface of the first sacrificial layer 222S. In example embodiments, a mask pattern may be formed on the gate mold structure 230, and the plurality of interlayer insulating layers 160 and the plurality of second sacrificial layers 230S may be sequentially anisotropically etched by using the mask pattern as an etching mask, until an upper surface of the first sacrificial layer 222S is exposed so that the channel hole Hch is formed.

Figure 8:
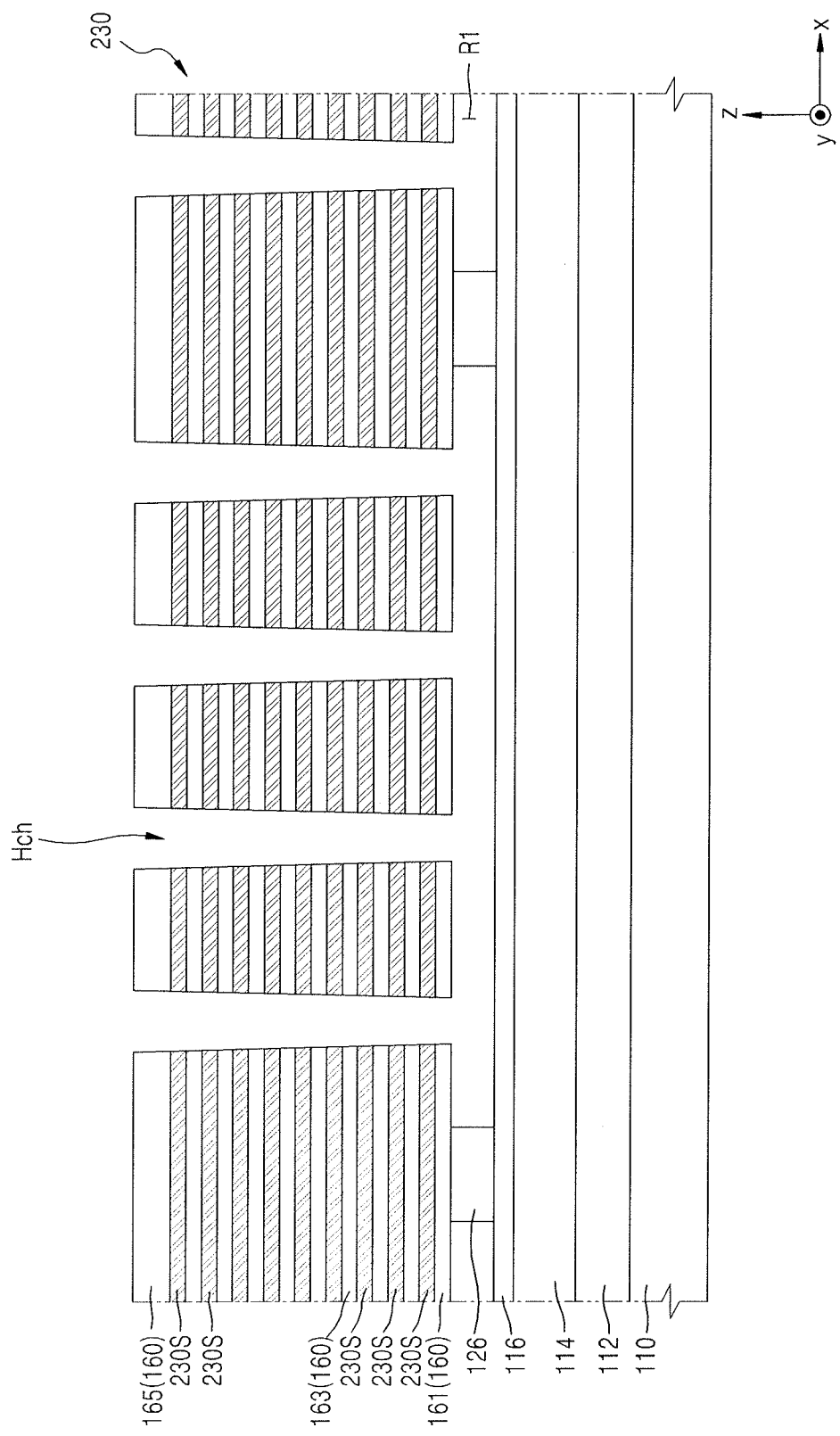

Referring to FIG. 8, by removing the first sacrificial layer 222S exposed through the channel hole Hch through a selective etching process, a first recess R1 may be formed in a portion from which the first sacrificial layer 222S has been removed. Accordingly, the channel hole Hch may extend in the third direction (z-direction) perpendicular to an upper surface of the substrate 110, and the first recess R1 may extend in the second direction (y-direction) that is in parallel with the upper surface of the substrate 110, and a bottom portion of the channel hole Hch may be communicatively connected to the first recess R1. In example embodiments, the selective etching process may be a wet etching process or a dry etching process.

Figure 9:
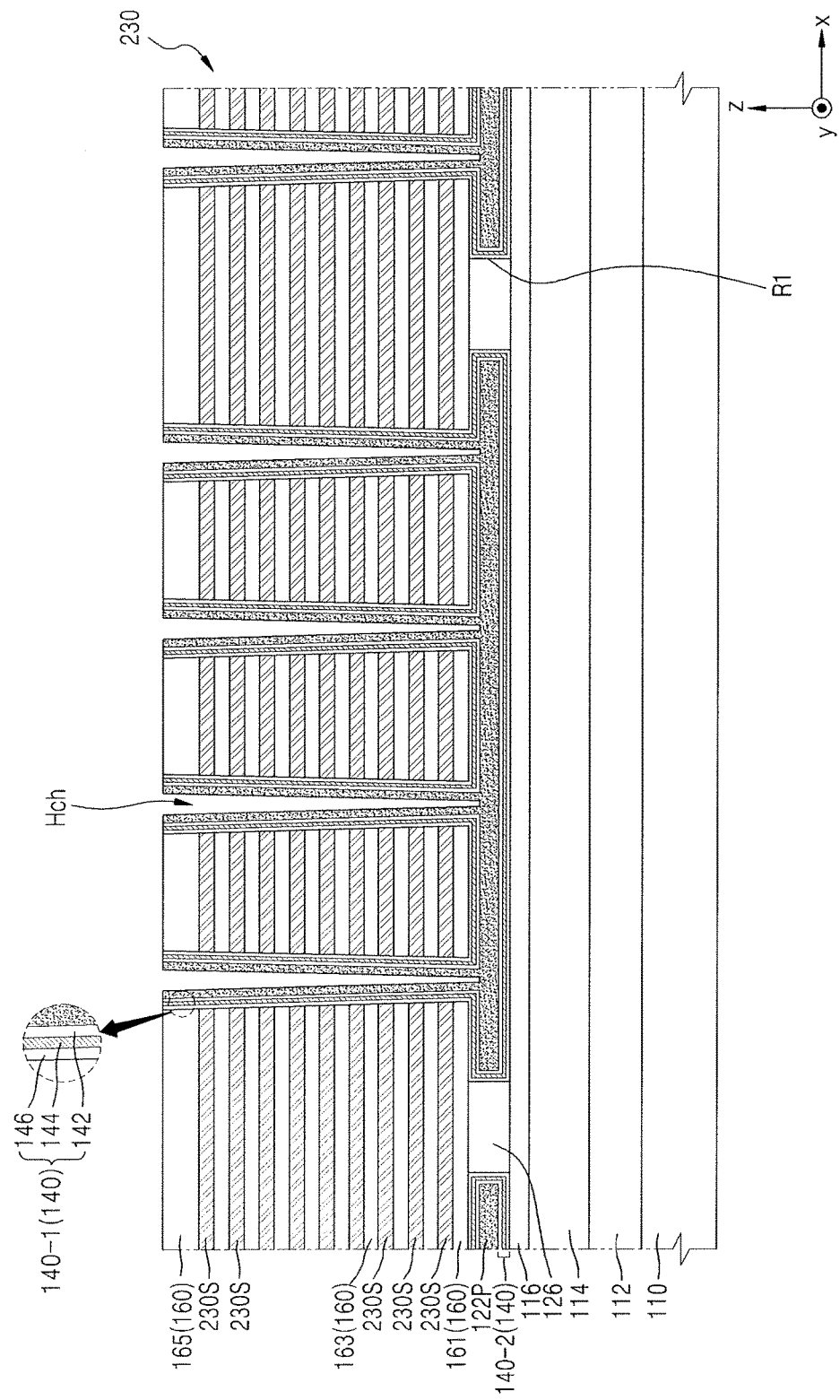

Referring to FIG. 9, the blocking insulating layer 146, the charge storage layer 144, and the tunneling insulating layer 142 may be sequentially formed on an inner wall of the channel hole Hch and an inner wall of the first recess R1 by using an ALD process, a CVD process or the like. The blocking insulating layer 146, the charge storage layer 144, and the tunneling insulating layer 142 may be collectively referred to as the gate insulating layer 140. The blocking insulating layer 146, the charge storage layer 144, and the tunneling insulating layer 142 may be formed of the materials described with reference to FIGS. 2 and 3.

The gate insulating layer 140 may be conformally formed on the inner wall of the channel hole Hch and the inner wall of the first recess R1. Here, for convenience, a portion of the gate insulating layer 140 disposed on the inner wall of the channel hole Hch will be referred to as the first gate insulating layer 140-1, and a portion of the gate insulating layer 140 disposed on the inner wall of the first recess R1 will be referred to as the second gate insulating layer 140-2.

Next, a conductive layer 122P may be formed on the inner wall of the channel hole Hch and the inner wall of the first recess R1. For example, after conformally forming the gate insulating layer 140 on sidewalls of the channel hole Hch and the first recess R1, the conductive layer 122P may fill a space surrounded by the gate insulating layer 140. For example, as illustrated in FIG. 9, the conductive layer 122P may be conformal on the insulating layer 140 in the channel hole Hch, and may be completely fill the space remaining in the first recess R1. For example, the conductive layer 122P may be formed of polysilicon, and while forming the conductive layer 122P, an n-type impurity may be doped in situ.

For example, as illustrated in FIG. 9, a thickness of the conductive layer 122P may not completely fill an inner portion of the channel hole Hch. In another example embodiments, after forming the conductive layer 122P having a predetermined thickness on the inner wall of the channel hole Hch and the inner wall of the first recess R1, a portion of the conductive layer 122P formed on the inner wall of the channel hole Hch may be removed, e.g., through an etch back process, and the conductive layer 122P may be formed on the inner wall of the channel hole Hch and the inner wall of the first recess R1 again until an inner portion of the first recess R1 is filled completely.

Figure 10:
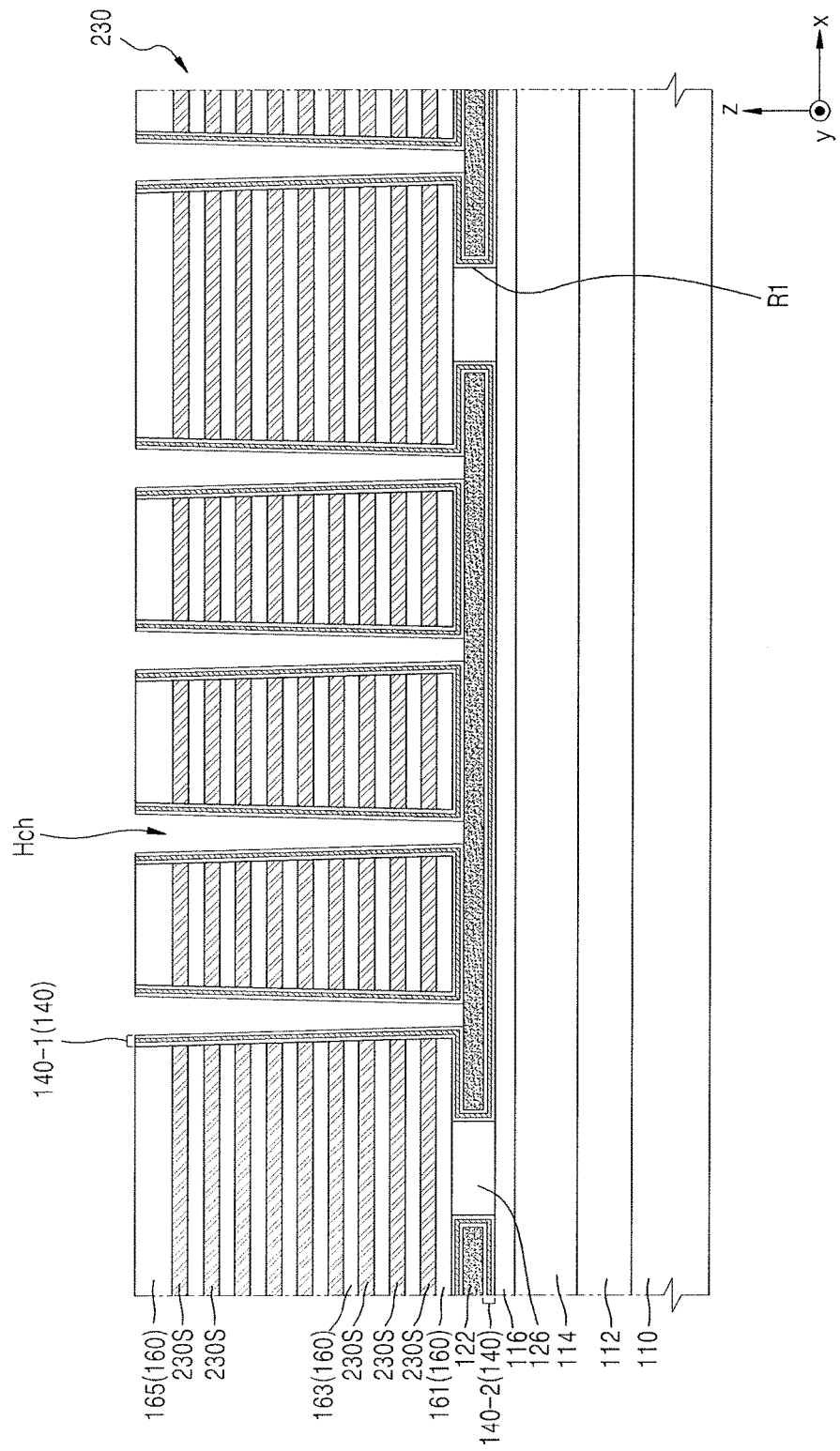

Referring to FIG. 10, by removing the conductive layer 122P (see FIG. 9) formed on a sidewall of the channel hole Hch via an etch-back process or the like, the common source extension region 122 filling the inner portion of the first recess R1 may be left. For example, as illustrated in FIG. 10, the conductive layer 122P may be completely removed from the sidewalls of the channel hole Hch to expose the first gate insulating layer 140-1 on the sidewall of the channel hole Hch, so the remaining portion of the conductive layer 122P in the first recess R1 defines the common source extension region 122.

Figure 11:
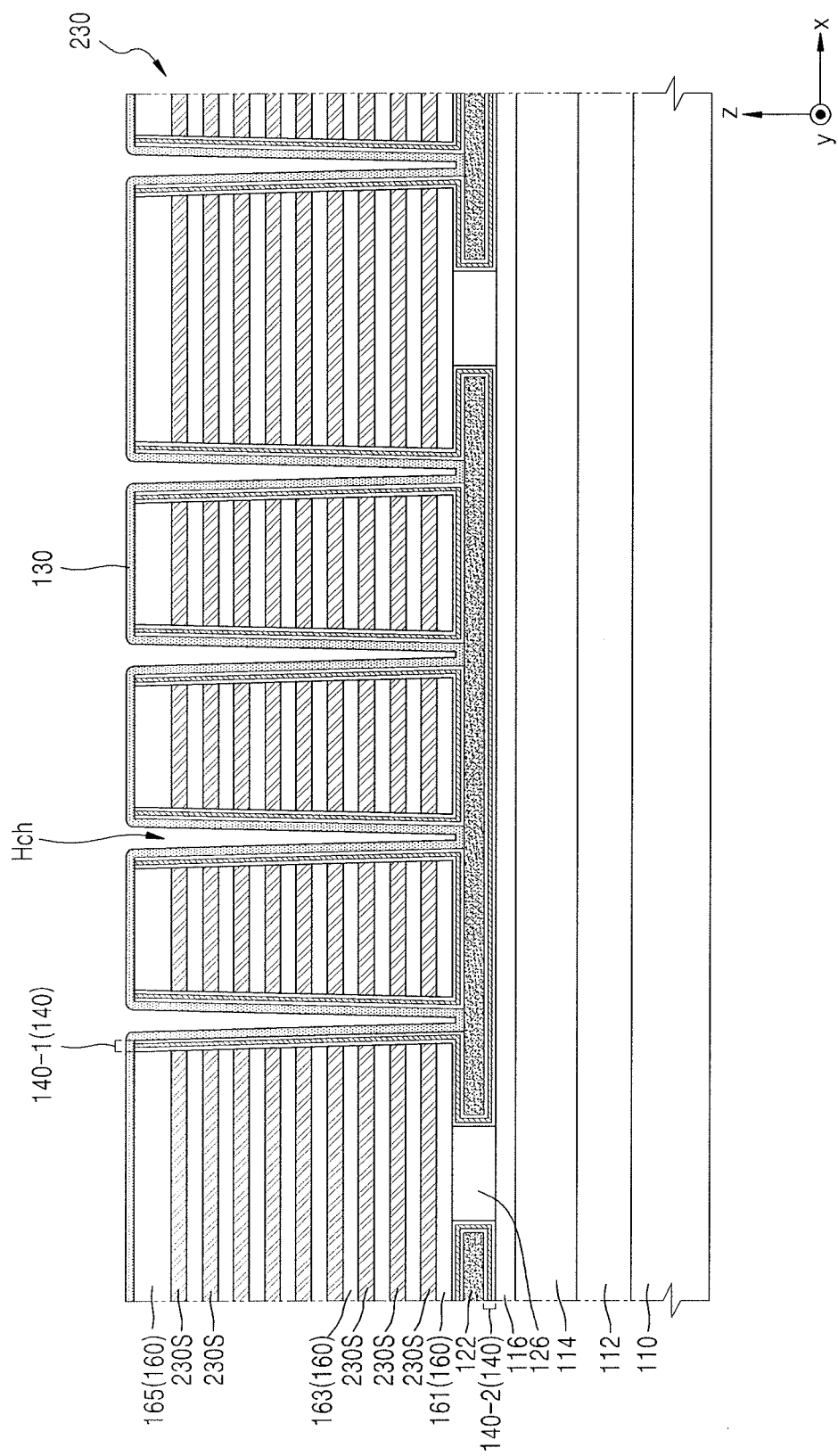

Referring to FIG. 11, the channel layer 130 may be formed on an upper surface of the gate mold structure 230 and the inner wall of the channel hole Hch. For example, the channel layer 130 may be formed of polysilicon by using an ALD process, a CVD process or the like. The channel layer 130 may be formed of polysilicon that is not doped with an impurity, or may be formed of polysilicon doped with a small amount of an n-type impurity or a p-type impurity. The channel layer 130 may contact the upper surface of the common source extension region 122 on the bottom portion of the channel hole Hch.

According to the semiconductor device of the comparative example, a semiconductor layer for a body contact may be formed on a bottom portion of a channel hole at a predetermined height through a SEG process, and a gate insulating layer may be formed on a sidewall of the channel hole and an upper surface of the semiconductor layer. Next, the upper surface of the semiconductor layer may be exposed by removing a portion of the gate insulating layer on the bottom portion of the channel hole through an anisotropic etching process, thereby forming a channel layer on an inner wall of the channel hole. In this case, the process for forming the semiconductor layer may be highly difficult (for example, it may be difficult to precisely adjust a height of the semiconductor layer), and/or the difficulty of the process for removing a gate insulating layer may be high (for example, it may be difficult to precisely remove the gate insulating layer on the bottom portion of the channel hole having a small size). Accordingly, in some channel holes, the semiconductor layer and the channel hole may not contact each other or a contact area thereof may be small, and thus, reliability of the semiconductor device may be degraded.

In contrast, according to the manufacturing method of the example embodiments, the SEG process or the anisotropic etching process of the gate insulating layer is not performed. Thus, even in the channel hole Hch having a relatively small size, sufficient contact between the common source extension region 122 and the channel layer 130 may be provided.

For example, as illustrated in FIG. 11, the channel layer 130 may not completely fill the channel hole Hch, e.g., may be conformally formed on the inner wall of the channel hole Hch. In another example, the channel layer 130 may completely fill the channel hole Hch.

Figure 12:
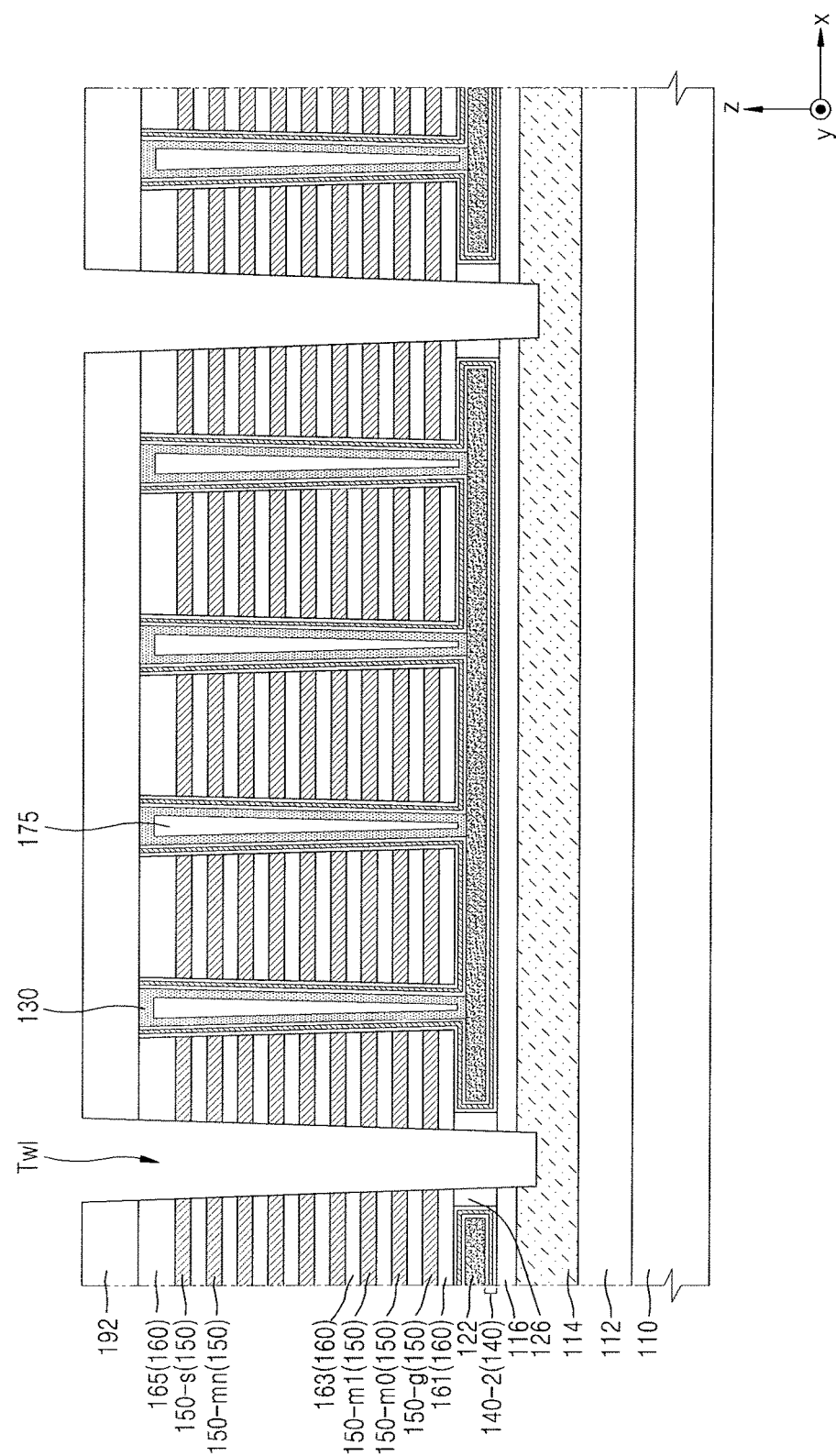

Referring to FIG. 12, the buried insulating layer 175 filling the channel hole Hch may be formed on the channel layer 130. Next, by removing a portion of an upper portion of the buried insulating layer 175, an upper portion of the channel hole Hch may be opened again, and then the channel hole Hch may be filled using a conductive layer so as to form the channel layer 130 having a cylindrical shape surrounding the buried insulating layer 175 in the channel hole Hch. An uppermost surface of the channel layer 130 may be at a substantially identical level as the upper surface of the gate mold structure 230 (FIG. 11).

Next, the upper insulating layer 192 may be formed on the gate mold structure 230 and the channel layer 130, and the common source opening portions Tw1 exposing the base layer 114 may be formed by etching the upper insulating layer 192 and the gate mold structure 230. The common source opening portions Tw1 may extend in the second direction (y-direction) and be spaced apart from each other in the first direction (x-direction). The common source opening portions Tw1 may correspond to an isolation trench or a word line cut. Here, as illustrated in FIG. 12, a portion of an upper portion of the base layer 114 may be recessed through the common source opening portion Tw1, e.g., via selective etching.

Next, the plurality of second sacrificial layers 230S (see FIG. 11) exposed through the common source opening portions Tw1 may be selectively removed, e.g., via selective etching, and a metal layer is formed in the common source opening portion Tw1 and a portion from which the plurality of second sacrificial layer 230S have been removed. The metal layer may be formed of, e.g., tungsten. Next, a portion of the metal layer corresponding to the common source opening portion Tw1 may be anisotropically etched again so that the metal layer remains only in a portion from which the plurality of second sacrificial layers 230S have been removed, thereby forming the plurality of gate electrodes 150.

Figure 13:
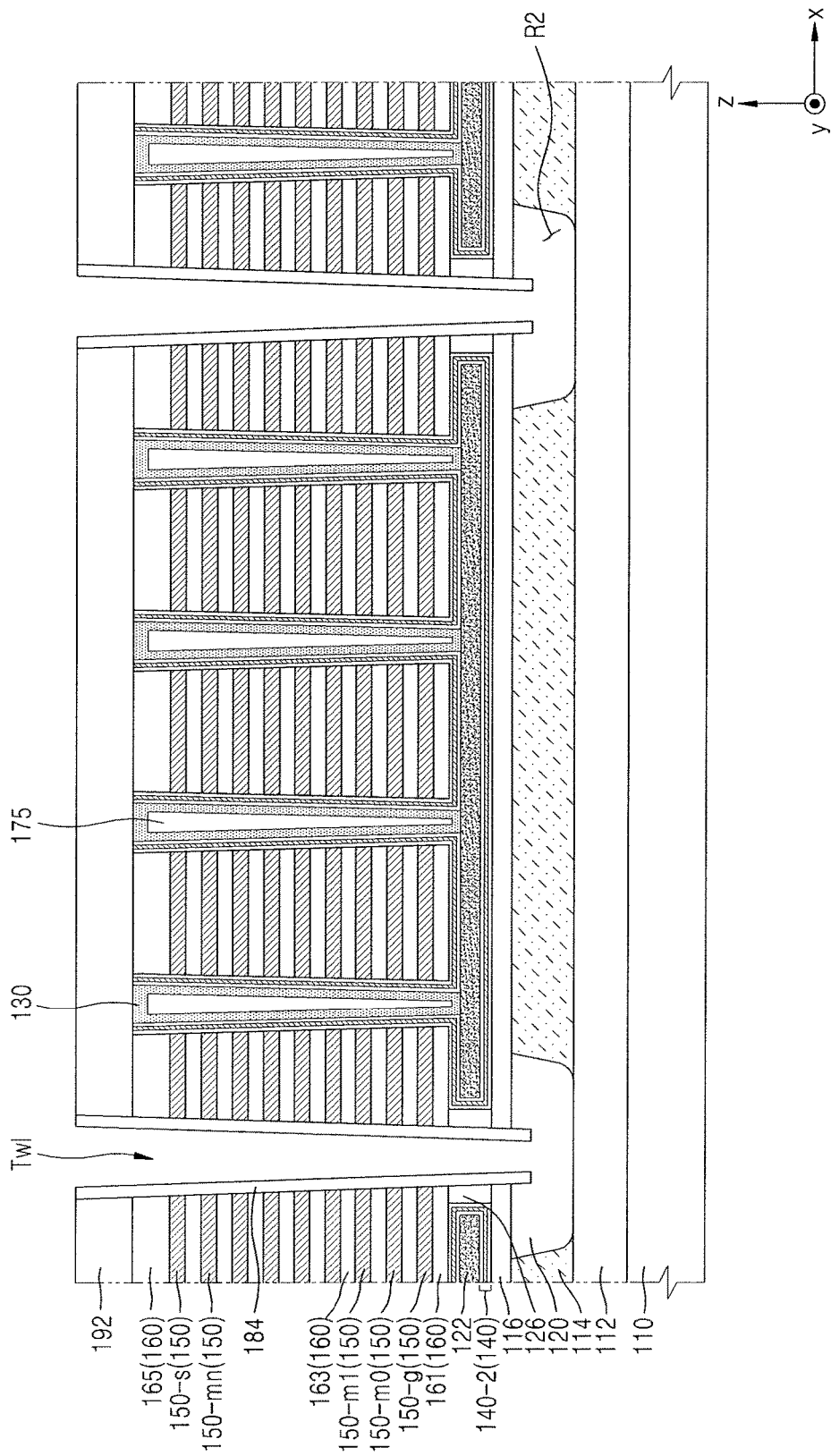

Referring to FIG. 13, an insulating layer is formed on an inner wall of the common source opening portion Tw1, and an anisotropic etching process may be performed on the insulating layer to thereby form an insulation spacer 184 on the sidewall of the common source opening portion Tw1. Next, by removing the base layer 114 exposed on the bottom portion of the common source opening portion Tw1, the bottom portion of the common source opening portion Tw1 may be expanded. The process of removing the base layer 114 may be a selective etching process including a wet process or a dry process.

The expanded bottom portion of the common source opening portion Tw1 may be referred to as a second recess R2. The second recess R2 may be communicatively connected to the bottom portion of the common source opening portion Tw1. The second recess R2 may be a space where a top portion and a bottom portion of the second recess R2 are respectively defined by the first lower insulating layer 116 and the isolation insulating layer 112, and a sidewall portion of the second recess R2 is defined by the base layer 114.

Figure 14:
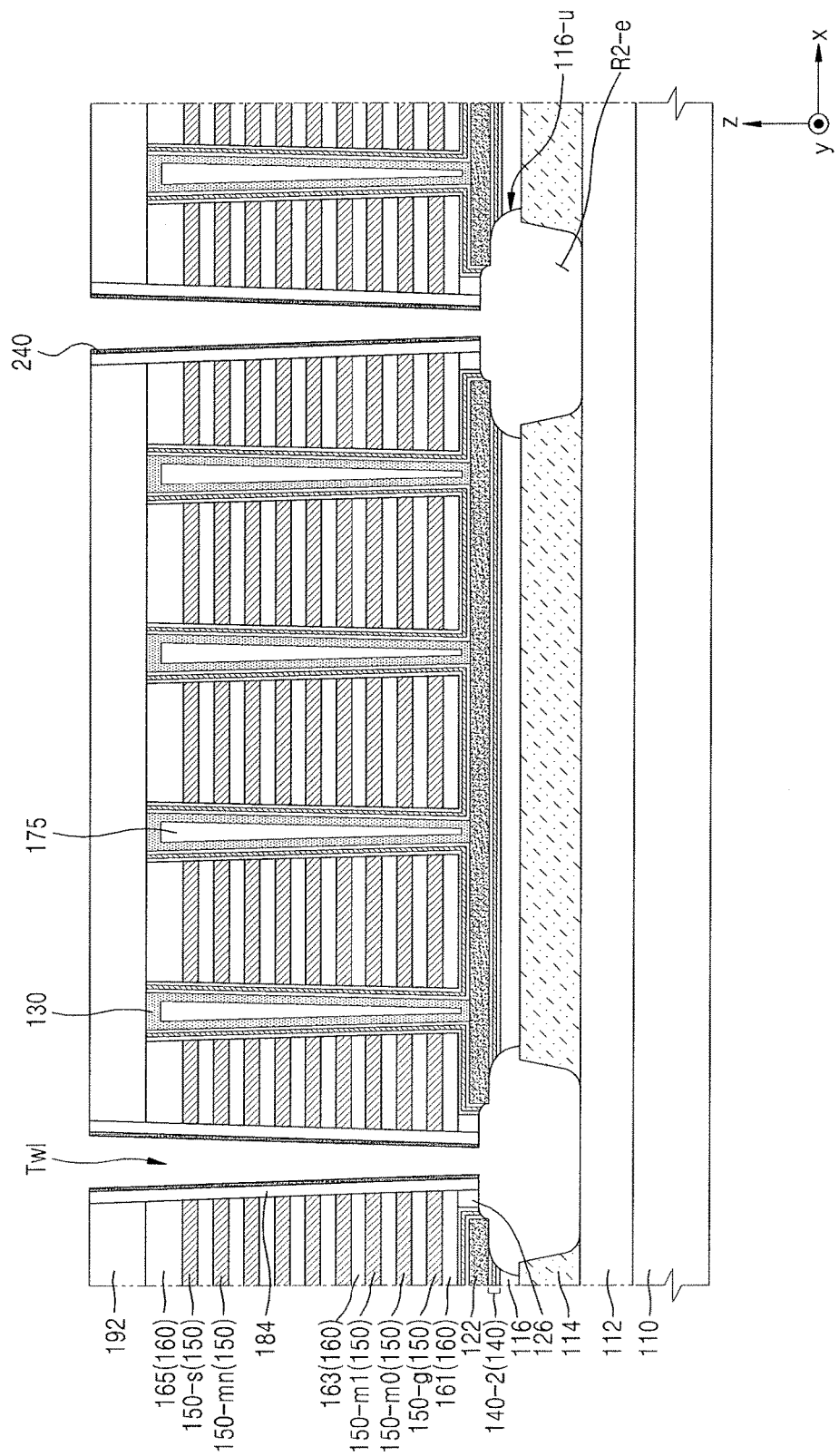

Referring to FIG. 14, the protection liner 240 may be formed of, e.g., polysilicon, on the sidewall of the common source opening portion Tw1. In detail, a conductive layer having a very small thickness may be formed on the inner wall of the common source opening portion Tw1 and the upper insulating layer 192, and then an anisotropic etching process may be performed on the conductive layer so as to leave the protection liner 240 only on the sidewall of the common source opening portion Tw1.

Next, by removing portions of the first lower insulating layer 116, the second lower insulating layer 126, and the insulation spacer 184 exposed through the second recess R2 (see FIG. 13), e.g., via selective etching, an expanded second recess R2-e may be formed. Through the expanded second recess R2-e, the second gate insulating layer 140-2 surrounding the bottom surface and the sidewall of the common source extension region 122 may be exposed. Next, by further removing the second gate insulating layer 140-2 exposed through the expanded second recess R2-e, a portion of the bottom surface and a portion of the sidewall of the common source extension region 122 may be exposed.

While forming the expanded second recess R2-e, portions of the first lower insulating layer 116 and the second gate insulating layer 140-2 between the common source extension region 122 and the base layer 114 may be removed together so as to form the undercut region 116-u. A shape or a size of the undercut region 116-u in the drawing is an example for convenience of description, and the undercut region 116-u may have a different shape or size than that illustrated in FIG. 14 according to conditions of the above removing process and/or a material composition of the second gate insulating layer 140-2.

Figure 15:
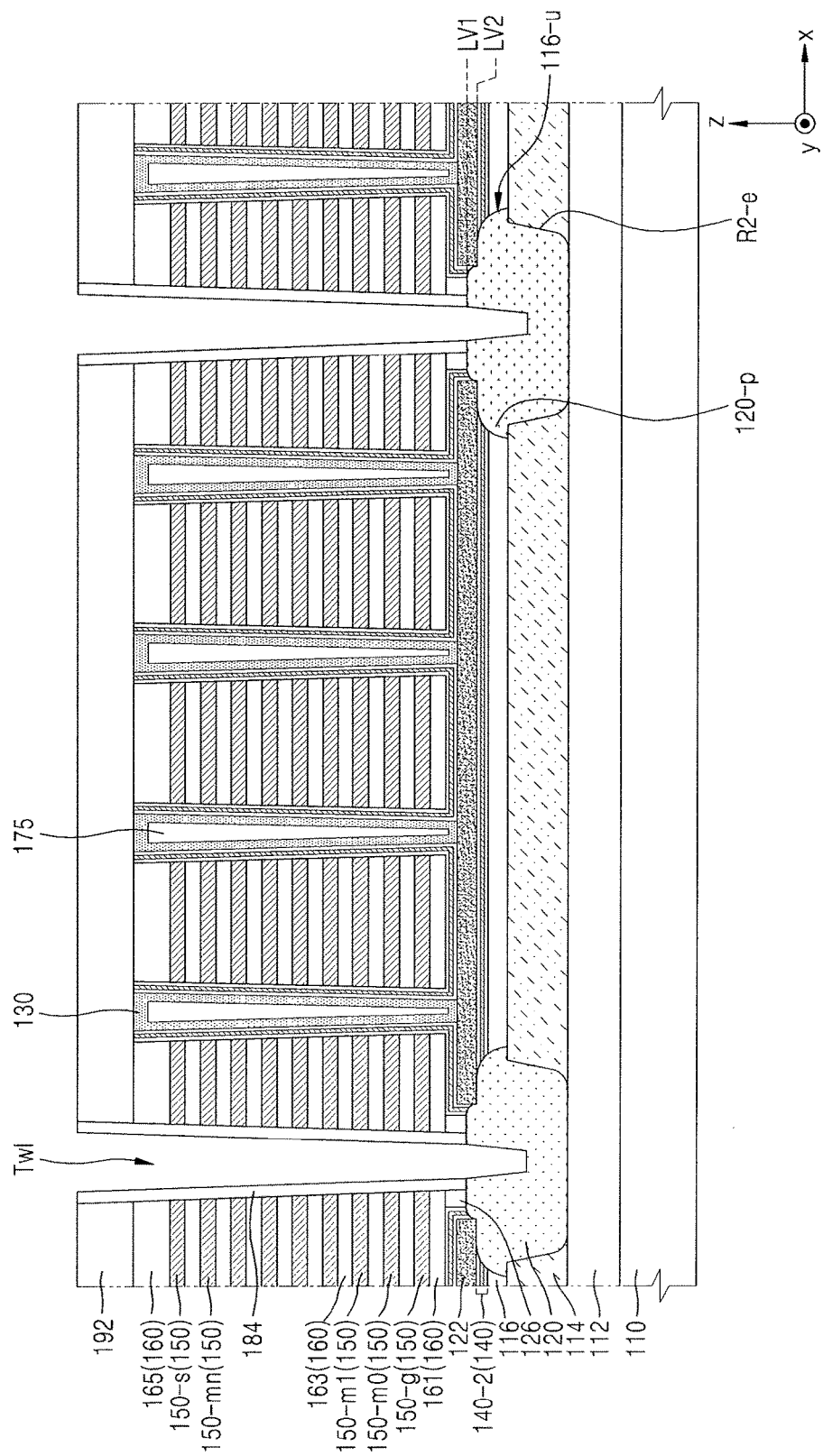

Referring to FIG. 15, a conductive layer is formed on inner walls of the common source opening portion Tw1 and the expanded second recess R2-e, and a portion of the conductive layer corresponding to the common source opening portion Tw1 may be anisotropically etched again so that the conductive layer remains only inside the expanded second recess R2-e, thereby forming the common source region 120. The common source region 120 may be formed of polysilicon, and while forming the common source region 120, an n-type conductivity impurity may be doped in situ. Alternatively, the common source region 120 may be formed of undoped polysilicon, and then an n-type conductivity impurity may be implanted into the common source region 120 through an ion implantation process or the like. Selectively, the protection liner 240 may be removed.

Figure 16:
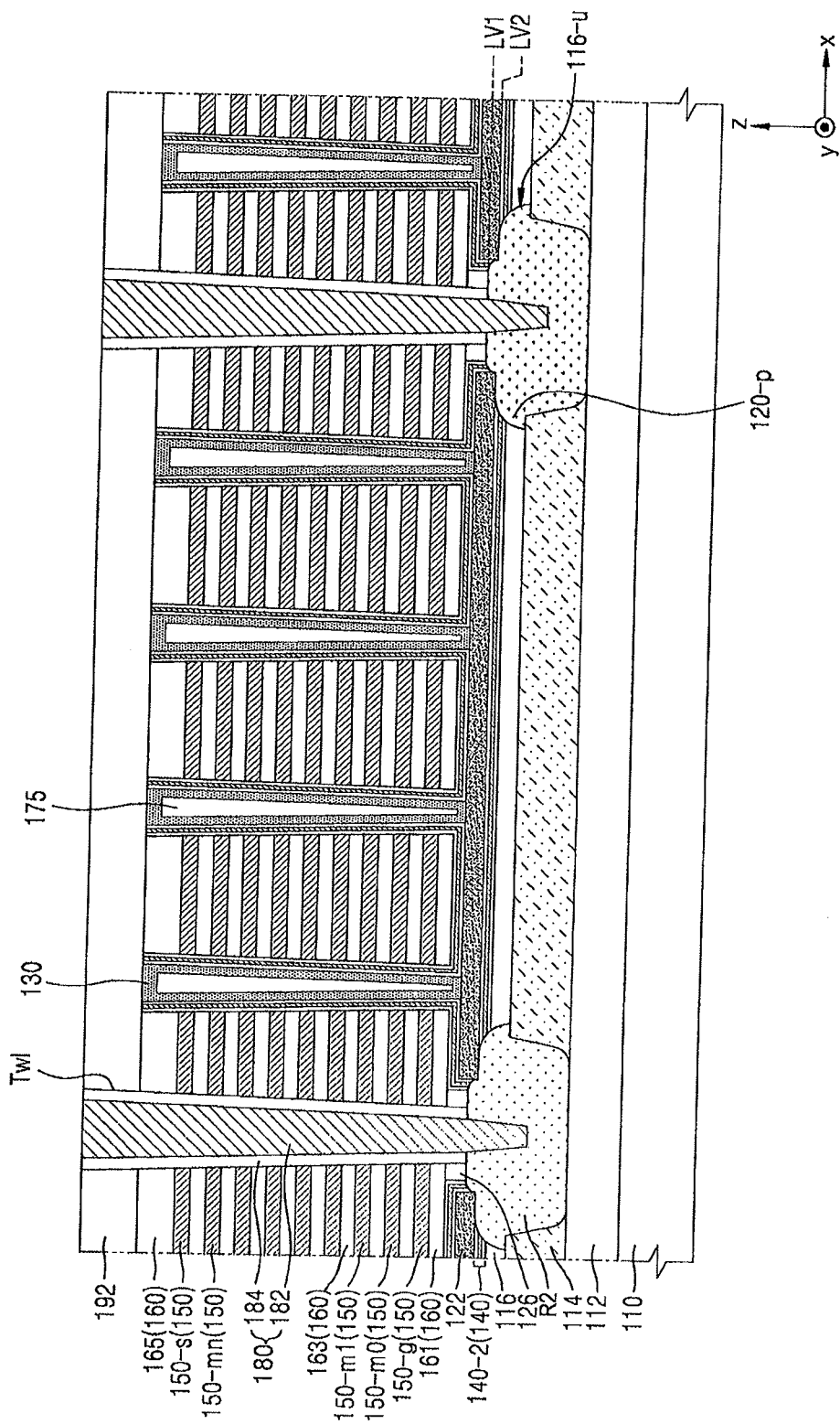

Referring to FIG. 16, a conductive layer is formed on the upper insulating layer 192 and in the common source opening portion Tw1, and an upper portion of the conductive layer may be planarized until an upper surface of the upper insulating layer 192 is exposed, thereby forming the metal layer 182 filling the common source opening portion Tw1.

Selectively, a metal silicide layer may be formed on the common source region 120 before forming the metal layer 182. Alternatively, after forming the metal layer 182, a metal silicide layer may be formed between the common source region 120 and the metal layer 182.

By performing the above-described processes, the semiconductor device 100 may be completed.

According to the manufacturing method of the semiconductor device 100, a SEG process or an anisotropic etching process of a gate insulating layer is not performed. Thus, the semiconductor device 100 having higher reliability may be manufactured through a simplified process.

Meanwhile, in the operation of forming the common source opening portion Tw1 described with reference to FIG. 12, the semiconductor device 100a of FIG. 4 or the semiconductor device 100b of FIG. 5 may be formed according to a recessed depth of an upper portion of the base layer 114. For example, if an upper portion of the base layer 114 is removed relatively deeply, a height difference may be generated at an upper surface of the expanded second recess R2-e, and thus, a concave portion 120a-c may be formed on an upper surface of the common source region 120a filling the expanded second recess R2-e. In this case, the semiconductor device 100a according to FIG. 4 may be formed. On the contrary, if an upper portion of the base layer 114 is removed relatively thinly, an upper surface of the expanded second recess R2-e may be at a substantially identical level as an upper surface level of the common source extension region 122, that is, the third level LV3, and in this case, the semiconductor device 100b of FIG. 5 may be formed.

Figure 17:
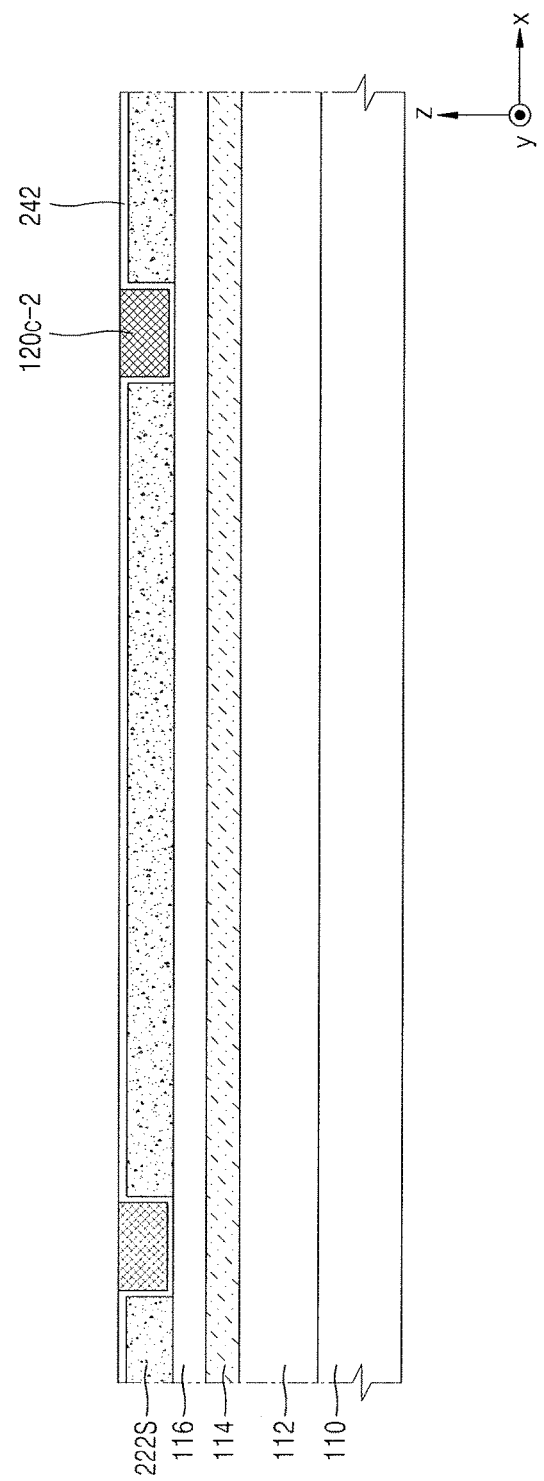
FIGS. 17 through 19 illustrate cross-sectional views of stages in a method of manufacturing a semiconductor device according to example embodiments.
Figure 18:
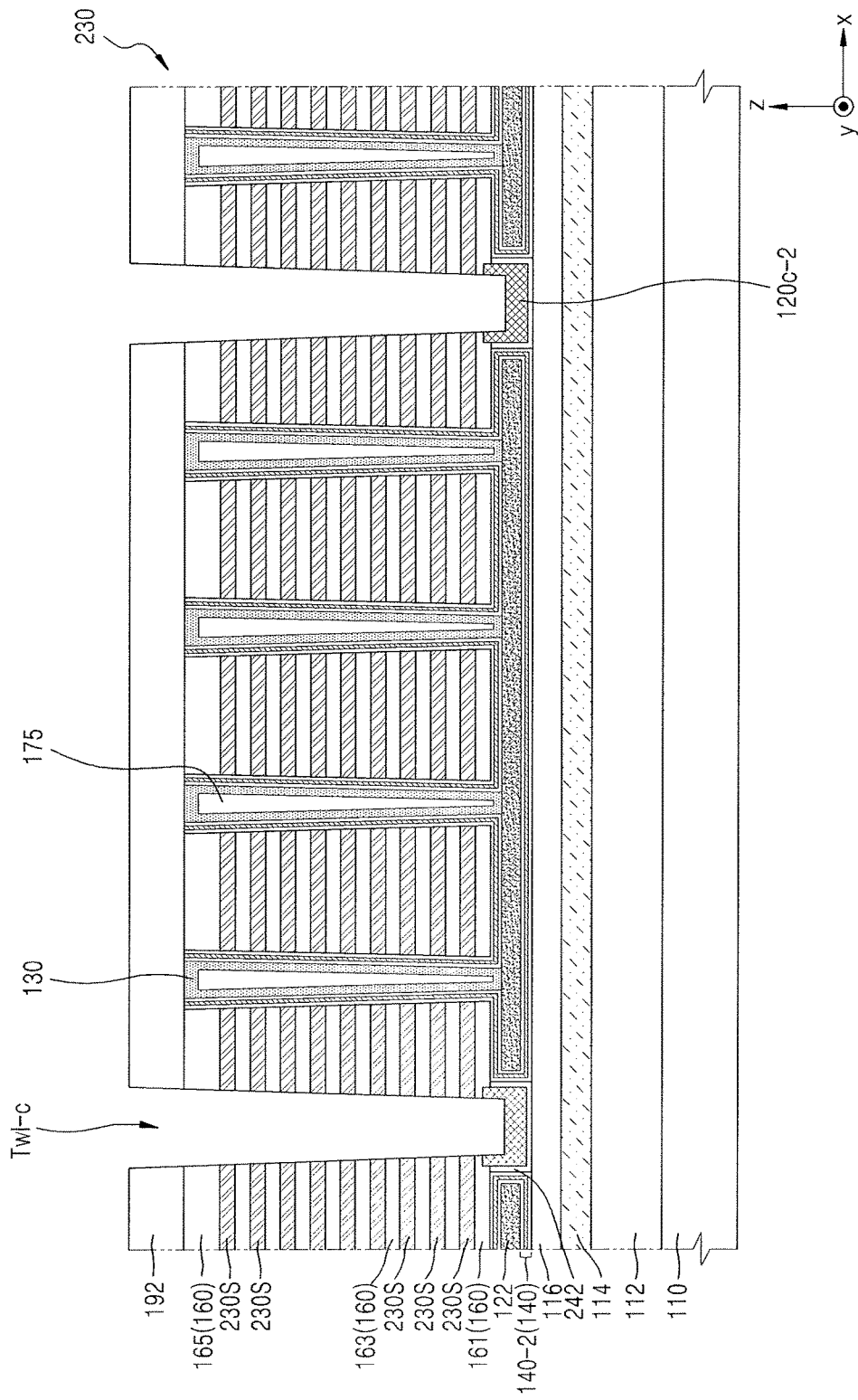
Figure 19:
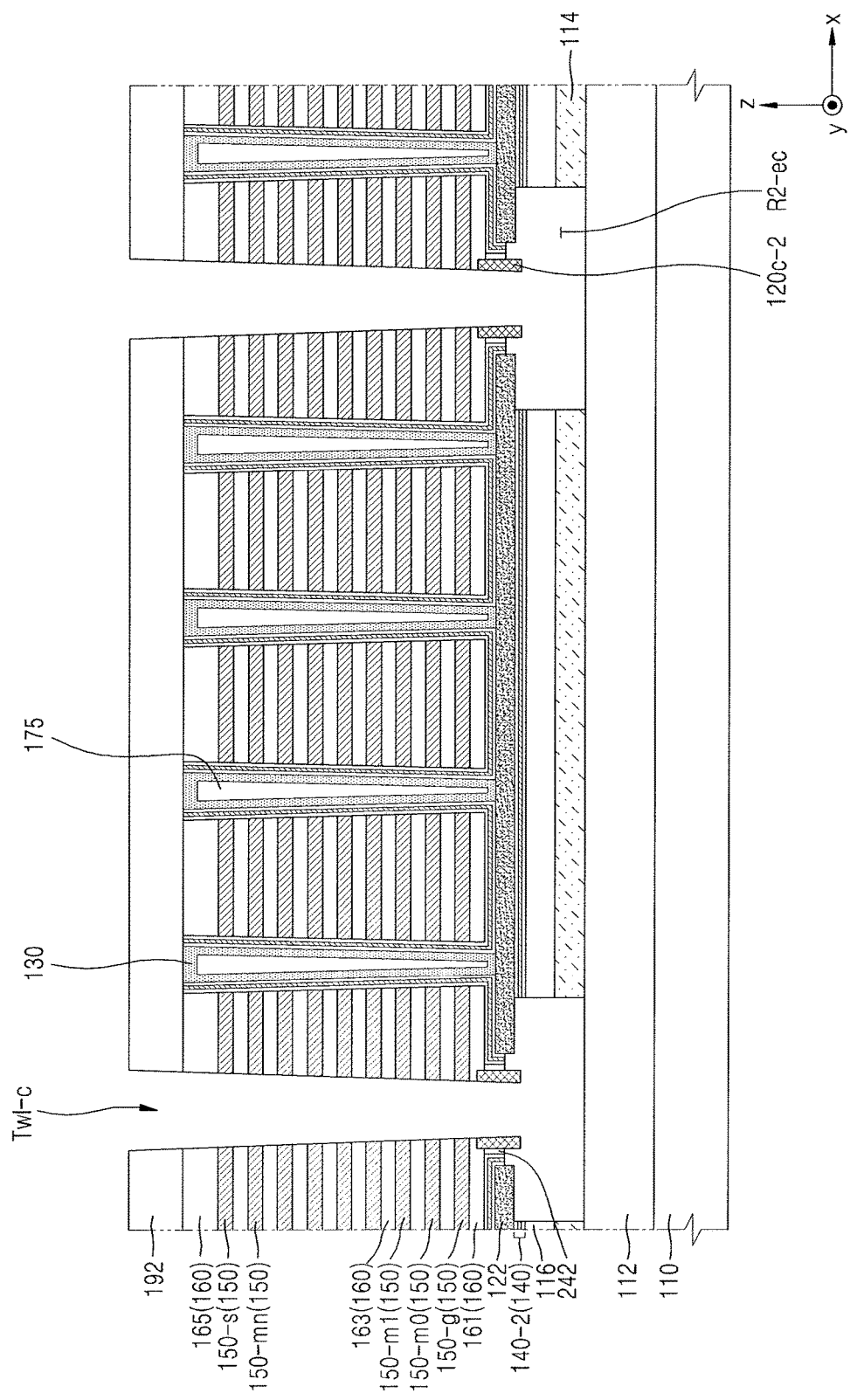

FIGS. 17 through 19 are cross-sectional views illustrating stages in a method of manufacturing the semiconductor device 100c according to example embodiments. In FIGS. 17 through 19, like reference numerals as those in FIGS. 1 through 16 denote like elements.

First, by performing the operation described with reference to FIG. 7, the isolation insulating layer 112, the base layer 114, and the first lower insulating layer 116, and the plurality of first sacrificial layers 222S may be formed on the substrate 110.

Referring to FIG. 17, an insulation liner 242 may be conformally formed of an insulation material on the plurality of first sacrificial layers 222S and the first lower insulating layer 116. The insulation liner 242 may be formed of a material having an etching selectivity with respect to the plurality of first sacrificial layers 222S.

Next, by forming a conductive layer on the insulation liner 242, space between the plurality of first sacrificial layers 222S may be filled, and an upper portion of the conductive layer may be planarized until an upper surface of the insulation liner 242 is exposed, thereby forming a support layer 120c-2 between the plurality of first sacrificial layers 222S. The support layer 120c-2 may have an upper surface at an identical level as an upper surface of the insulation liner 242.

Next, by performing the operations described with reference to FIGS. 8 through 12, a structure in which an upper insulating layer 192 is formed on the channel layers 130 and the interlayer insulating layers 160 is completed.

Referring to FIG. 18, by etching the upper insulating layer 192 and the gate mold structure 230, a common source opening portion Tw1-c exposing the support layer 120c-2 may be formed.

Referring to FIG. 19, the support layer 120c-2 exposed on a bottom portion of the common source opening portion Tw1-c may be further removed, and then the first lower insulating layer 116 and the base layer 114 may be sequentially removed so as to form an expanded second recess R2-ec that is communicatively connected to the bottom portion of the common source opening portion Tw1-c.

Next, the operations described with reference to FIGS. 12 through 16 may be performed to complete the semiconductor device 100c.

That is, according to the above-described manufacturing method, in the process for forming the common source opening portion Tw1-c and the expanded second recess R2-ec, the support layer 120c-2 may function as an etch stopper layer, and thus, an etching operation for expanding the common source opening portion Tw1-c may be precisely adjusted. In addition, even when a distance between the common source extension regions 122 is small, a relatively broad contact area may be ensured between the metal layer 182 and the support layer 120c-2 and between the metal layer 182 and the common source semiconductor layer 120c-1.

By way of summation and review, due to down-scaling of the memory device, reliability of the vertical channel layer may be degraded, and the manufacturing process may become complicated. Therefore, embodiments provide a semiconductor device with a vertical channel that has high reliability, and a method of manufacturing the semiconductor device by using a simplified process.

That is, according to embodiments, instead of a body erase method in which holes are received from a substrate, a method in which electrons and holes are generated from an n+ semiconductor layer (common source extension region) due to a high electric field, and then are injected into a channel structure, i.e., a gate induced drain leakage (GIDL) method, is used. As the complicated selective epitaxial growth (SEG) process is omitted, a semiconductor device having a simplified structure may be provided through a simplified process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a plurality of channel structures on a substrate, each channel structure of the plurality of channel structures extending in a first direction perpendicular to an upper surface of the substrate, and having a gate insulating layer and a channel layer;
    a common source extension region between the substrate and the plurality of channel structures, the common source extension region including a first semiconductor layer having an n-type conductivity;
    a plurality of gate electrodes on the common source extension region and spaced apart from each other on a sidewall of each of the plurality of channel structures in the first direction; and
    a common source region on the substrate, the common source region being in contact with the common source extension region and including a second semiconductor layer having an n-type conductivity,
    wherein the gate insulating layer of each of the plurality of channel structures extends to cover an upper surface and at least a portion of a bottom surface of the common source extension region.

2. The semiconductor device as claimed in claim 1, wherein a portion of the gate insulating layer extends from a sidewall of the channel layer, and the portion of the gate insulating layer covers the upper surface, a sidewall, and a portion of the bottom surface of the common source extension region.

3. The semiconductor device as claimed in claim 1, wherein a portion of the bottom surface of the common source extension region is in contact with the common source region.

4. The semiconductor device as claimed in claim 1, wherein an upper surface of the second semiconductor layer is at a level that is lower than or identical to the upper surface of the common source extension region.

5. The semiconductor device as claimed in claim 1, further comprising:
    a base layer between the common source extension region and the substrate and having an n-type conductivity; and
    a lower insulating layer between the base layer and the common source extension region.

6. The semiconductor device as claimed in claim 5, wherein a bottom surface of the common source region is at an identical level as a bottom surface of the base layer, and
    the plurality of channel structures are electrically insulated from the substrate by the lower insulating layer.

7. The semiconductor device as claimed in claim 5, wherein a portion of the gate insulating layer is between the common source extension region and the lower insulating layer.

8. The semiconductor device as claimed in claim 5, wherein an undercut region is in a portion of the lower insulating layer between the common source extension region and the base layer, and the common source region includes a protrusion that fills the undercut region and contacts the lower insulating layer.

9. The semiconductor device as claimed in claim 1, wherein the common source region further includes a support layer that is on the second semiconductor layer, spaced apart from the common source extension region, and electrically connected to the common source extension region via the second semiconductor layer of the common source region.

10. The semiconductor device as claimed in claim 9, wherein an upper surface of the support layer is at a higher level than the upper surface of the common source extension region.

11. The semiconductor device as claimed in claim 9, further comprising a common source line on the common source region, wherein the support layer surrounds a lower sidewall of the common source line.

12. A semiconductor device, comprising:
- a base layer on a substrate and having an n-type conductivity;
- a common source extension region on the base layer and including a first semiconductor layer having an n-type conductivity;
- a plurality of channel structures on the common source extension region and extending in a first direction perpendicular to an upper surface of the substrate, each of the plurality of channel structures having a gate insulating layer and a channel layer;
- a plurality of gate electrodes on the common source extension region and spaced apart from each other on a sidewall of each of the plurality of channel structures in the first direction; and
- a common source region on the substrate, the common source region being in contact with a portion of a bottom surface of the common source extension region and including a second semiconductor layer having an n-type conductivity, wherein a portion of the gate insulating layer of each of the plurality of channel structures extends to cover an upper surface and at least a portion of the bottom surface of the common source extension region.

13. The semiconductor device as claimed in claim 12, further comprising a lower insulating layer between the base layer and the common source extension region, the plurality of channel structures being electrically insulated from the substrate by the lower insulating layer.

14. The semiconductor device as claimed in claim 13, wherein an undercut region is in a portion of the lower insulating layer between the common source extension region and the base layer, the common source region including a protrusion that fills the undercut region and contacts the lower insulating layer.

15. The semiconductor device as claimed in claim 12, wherein a bottom surface of the common source region is at an identical level as a bottom surface of the base layer.

16. The semiconductor device as claimed in claim 12, wherein the common source region includes a support layer on the second semiconductor layer and having an upper surface that is at a higher level than the upper surface of the common source extension region.

* * * * *